United States Patent
Boone et al.

(10) Patent No.: US 10,367,139 B2
(45) Date of Patent: Jul. 30, 2019

(54) METHODS OF MANUFACTURING MAGNETIC TUNNEL JUNCTION DEVICES

(71) Applicant: Spin Transfer Technologies, Inc., Fremont, CA (US)

(72) Inventors: Thomas Boone, Fremont, CA (US); Pradeep Manandhar, Fremont, CA (US); Manfred Schabes, Fremont, CA (US); Bartlomiej Kardasz, Fremont, CA (US); Mustafa Pinarbasi, Fremont, CA (US)

(73) Assignee: Spin Memory, Inc., Fremont, CA (US)

( * ) Notice: Subject to any disclaimer, the term of this patent is extended or adjusted under 35 U.S.C. 154(b) by 0 days.

(21) Appl. No.: 15/859,230

(22) Filed: Dec. 29, 2017

(65) Prior Publication Data

US 2019/0207105 A1    Jul. 4, 2019

(51) Int. Cl.
| | |
|---|---|
| *H01L 43/12* | (2006.01) |
| *H01L 43/08* | (2006.01) |
| *H01L 27/22* | (2006.01) |
| *H01L 43/10* | (2006.01) |
| *H01L 43/02* | (2006.01) |

(52) U.S. Cl.
CPC ............ *H01L 43/12* (2013.01); *H01L 27/222* (2013.01); *H01L 43/02* (2013.01); *H01L 43/08* (2013.01); *H01L 43/10* (2013.01)

(58) Field of Classification Search
CPC ................................. H01L 43/02; H01L 43/12
See application file for complete search history.

(56) References Cited

U.S. PATENT DOCUMENTS

| | | |
|---|---|---|
| 4,597,487 A | 7/1986 | Crosby et al. |
| 5,541,868 A | 7/1996 | Prinz |
| 5,559,952 A | 9/1996 | Fujimoto |
| 5,629,549 A | 5/1997 | Johnson |
| 5,640,343 A | 6/1997 | Gallagher et al. |
| 5,654,566 A | 8/1997 | Johnson |
| 5,691,936 A | 11/1997 | Sakahima et al. |
| 5,695,846 A | 12/1997 | Lange et al. |
| 5,695,864 A | 12/1997 | Zlonczewski |
| 5,732,016 A | 3/1998 | Chen et al. |
| 5,751,647 A | 5/1998 | O'Toole |
| 5,856,897 A | 1/1999 | Mauri |
| 5,896,252 A | 4/1999 | Kanai |

(Continued)

FOREIGN PATENT DOCUMENTS

| | | |
|---|---|---|
| CA | 2766141 | 1/2011 |
| CN | 105706259 | 6/2016 |

(Continued)

OTHER PUBLICATIONS

US 7,026,672 B2, 05/2006, Sharma (withdrawn)

(Continued)

*Primary Examiner* — Mounir S Amer

(57) ABSTRACT

A method of manufacturing a Magnetic Tunnel Junction (MTJ) device including pillar contacts coupling the free magnetic layer of MTJ pillars to a top contact. The pillar contacts are electrically isolated from one or more other portions of the MTJ pillar by one or more self-aligned sidewall insulators. The MTJ device further including one of a static magnetic compensation layer or an exchange spring layer in the MTJ pillar.

25 Claims, 30 Drawing Sheets

(56) References Cited

U.S. PATENT DOCUMENTS

| | | |
|---|---|---|
| 5,966,323 A | 10/1999 | Chen et al. |
| 6,016,269 A | 1/2000 | Peterson et al. |
| 6,055,179 A | 4/2000 | Koganei et al. |
| 6,064,948 A | 5/2000 | West |
| 6,075,941 A | 6/2000 | Itoh |
| 6,097,579 A | 8/2000 | Gill |
| 6,112,295 A | 8/2000 | Bhamidipati et al. |
| 6,124,711 A | 9/2000 | Tanaka et al. |
| 6,134,138 A | 10/2000 | Lu et al. |
| 6,140,838 A | 10/2000 | Johnson |
| 6,154,349 A | 11/2000 | Kanai et al. |
| 6,172,902 B1 | 1/2001 | Wegrowe et al. |
| 6,233,172 B1 | 5/2001 | Chen et al. |
| 6,233,690 B1 | 5/2001 | Choi et al. |
| 6,243,288 B1 | 6/2001 | Ishikawa et al. |
| 6,252,798 B1 | 6/2001 | Satoh et al. |
| 6,256,123 B1 | 7/2001 | Sun |
| 6,256,223 B1 | 7/2001 | Sun |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,442,681 B1 | 8/2002 | Ryan et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swansom et al. |
| 6,545,903 B1 | 4/2003 | Savtchenko |
| 6,545,906 B1 | 4/2003 | Savtchenko et al. |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,653,153 B2 | 11/2003 | Xiong et al. |
| 6,654,278 B1 | 11/2003 | Engel et al. |
| 6,677,165 B1 | 1/2004 | La et al. |
| 6,710,984 B1 | 3/2004 | Yuasa et al. |
| 6,713,195 B2 | 3/2004 | Wang et al. |
| 6,714,444 B2 | 3/2004 | Huai |
| 6,731,537 B2 | 5/2004 | Kanamori |
| 6,744,086 B2 | 6/2004 | Daughton et al. |
| 6,750,491 B2 | 6/2004 | Sharma et al. |
| 6,765,824 B2 | 7/2004 | Kishi et al. |
| 6,772,036 B2 | 8/2004 | You et al. |
| 6,773,515 B2 | 8/2004 | Li et al. |
| 6,777,730 B2 | 8/2004 | Daughton et al. |
| 6,785,159 B2 | 8/2004 | Tuttle |
| 6,812,437 B2 | 11/2004 | Levy |
| 6,829,161 B2 | 12/2004 | Huai et al. |
| 6,835,423 B2 | 12/2004 | Chen et al. |
| 6,838,740 B2 | 1/2005 | Huai et al. |
| 6,839,821 B2 | 1/2005 | Estakhri |
| 6,842,317 B2 | 1/2005 | Sugita et al. |
| 6,847,547 B2 | 1/2005 | Albert et al. |
| 6,887,719 B2 | 5/2005 | Lu et al. |
| 6,888,742 B1 | 5/2005 | Nguyen et al. |
| 6,902,807 B1 | 6/2005 | Argitia et al. |
| 6,906,369 B2 | 6/2005 | Ross et al. |
| 6,920,063 B2 | 7/2005 | Huai et al. |
| 6,933,155 B2 | 8/2005 | Albert |
| 6,938,142 B2 | 8/2005 | Pawlowski |
| 6,958,927 B1 | 10/2005 | Nguyen et al. |
| 6,967,863 B2 | 11/2005 | Huai |
| 6,980,469 B2 | 12/2005 | Kent et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,006,371 B2 | 2/2006 | Matsuoka |
| 7,006,375 B2 | 2/2006 | Covington |
| 7,009,877 B1 | 3/2006 | Huai et al. |
| 7,041,598 B2 | 5/2006 | Sharma |
| 7,045,368 B2 | 5/2006 | Hong et al. |
| 7,057,922 B2 | 6/2006 | Fukumoto |
| 7,170,778 B2 | 1/2007 | Kent et al. |
| 7,187,577 B1 | 3/2007 | Wang |
| 7,190,611 B2 | 3/2007 | Nguyen et al. |
| 7,203,129 B2 | 4/2007 | Lin et al. |
| 7,227,773 B1 | 6/2007 | Nguyen et al. |
| 7,262,941 B2 | 8/2007 | Li et al. |
| 7,307,876 B2 | 12/2007 | Kent et al. |
| 7,324,387 B1 | 1/2008 | Bergemont et al. |
| 7,335,960 B2 | 2/2008 | Han et al. |
| 7,351,594 B2 | 4/2008 | Bae et al. |
| 7,352,021 B2 | 4/2008 | Bae et al. |
| 7,372,722 B2 | 5/2008 | Jeong et al. |
| 7,376,006 B2 | 5/2008 | Bednorz et al. |
| 7,386,765 B2 | 6/2008 | Ellis |
| 7,436,699 B2 | 10/2008 | Tanizaki et al. |
| 7,449,345 B2 | 11/2008 | Horng et al. |
| 7,453,719 B2 | 11/2008 | Sakimura |
| 7,476,919 B2 | 1/2009 | Hong et al. |
| 7,502,249 B1 | 3/2009 | Ding |
| 7,573,737 B2 | 8/2009 | Kent et al. |
| 7,598,555 B1 | 10/2009 | Papworth-Parkin |
| 7,619,431 B2 | 11/2009 | DeWilde et al. |
| 7,642,612 B2 | 1/2010 | Izumi et al. |
| 7,660,161 B2 | 2/2010 | Van Tran |
| 7,733,699 B2 | 6/2010 | Roohparvar |
| 7,773,439 B2 | 8/2010 | Do et al. |
| 7,776,665 B2 | 8/2010 | Izumi et al. |
| 7,852,662 B2 | 12/2010 | Yang |
| 7,881,095 B2 | 2/2011 | Lu |
| 7,911,832 B2 | 3/2011 | Kent et al. |
| 7,936,595 B2 | 5/2011 | Han et al. |
| 7,986,544 B2 | 7/2011 | Kent et al. |
| 8,080,365 B2 | 12/2011 | Nozaki |
| 8,088,556 B2 | 1/2012 | Nozaki |
| 8,094,480 B2 | 1/2012 | Tonomura |
| 8,144,509 B2 | 3/2012 | Jung |
| 8,148,970 B2 | 4/2012 | Fuse |
| 8,255,742 B2 | 8/2012 | Ipek |
| 8,278,996 B2 | 10/2012 | Miki |
| 8,279,666 B2 | 10/2012 | Dieny et al. |
| 8,334,213 B2 | 12/2012 | Mao |
| 8,349,536 B2 | 1/2013 | Nozaki |
| 8,363,465 B2 | 1/2013 | Kent et al. |
| 8,386,836 B2 | 2/2013 | Burger |
| 8,432,727 B2 | 4/2013 | Ryu |
| 8,441,844 B2 | 5/2013 | El Baraji |
| 8,456,883 B1 | 6/2013 | Liu |
| 8,456,926 B2 | 6/2013 | Ong |
| 8,492,881 B2 | 7/2013 | Kuroiwa et al. |
| 8,535,952 B2 | 9/2013 | Ranjan et al. |
| 8,539,303 B2 | 9/2013 | Lu |
| 8,549,303 B2 | 10/2013 | Fifield et al. |
| 8,574,928 B2 | 11/2013 | Satoh et al. |
| 8,582,353 B2 | 11/2013 | Lee |
| 8,593,868 B2 | 11/2013 | Park |
| 8,617,408 B2 | 12/2013 | Balamane |
| 8,625,339 B2 | 1/2014 | Ong |
| 8,634,232 B2 | 1/2014 | Oh |
| 8,716,817 B2 | 5/2014 | Saida |
| 8,737,137 B1 | 5/2014 | Choy et al. |
| 8,780,617 B2 | 7/2014 | Kang |
| 8,792,269 B1 | 7/2014 | Abedifard |
| 8,852,760 B2 | 10/2014 | Wang et al. |
| 8,902,628 B2 | 12/2014 | Ha |
| 8,966,345 B2 | 2/2015 | Wilkerson |
| 9,019,754 B1 | 4/2015 | Bedeschi |
| 9,026,888 B2 | 5/2015 | Kwok |
| 9,043,674 B2 | 5/2015 | Wu |
| 9,082,888 B2 | 7/2015 | Kent et al. |
| 9,104,595 B2 | 8/2015 | Sah |
| 9,140,747 B2 | 9/2015 | Kim |
| 9,165,629 B2 | 10/2015 | Chih |
| 9,166,155 B2 * | 10/2015 | Deshpande ............ G11B 5/84 |
| 9,229,853 B2 | 1/2016 | Khan |
| 9,245,608 B2 | 1/2016 | Chen et al. |
| 9,250,990 B2 | 2/2016 | Motwani |
| 9,263,667 B1 | 2/2016 | Pinarbasi |
| 9,298,552 B2 | 3/2016 | Leem |

(56) References Cited

U.S. PATENT DOCUMENTS

| | | |
|---|---|---|
| 9,299,412 B2 | 3/2016 | Naeimi |
| 9,317,429 B2 | 4/2016 | Ramanujan |
| 9,337,412 B2 | 5/2016 | Pinarbasi et al. |
| 9,362,486 B2 | 6/2016 | Kim et al. |
| 9,378,817 B2 | 6/2016 | Kawai |
| 9,396,991 B2 | 7/2016 | Arvin et al. |
| 9,401,536 B2 | 7/2016 | Arvin et al. |
| 9,406,876 B2 | 8/2016 | Pinarbasi |
| 9,418,721 B2 | 8/2016 | Bose |
| 9,449,720 B1 | 9/2016 | Lung |
| 9,450,180 B1 | 9/2016 | Annunziata |
| 9,455,013 B2 | 9/2016 | Kim |
| 9,472,282 B2 | 10/2016 | Lee |
| 9,472,748 B2 | 10/2016 | Kuo et al. |
| 9,484,527 B2 | 11/2016 | Han et al. |
| 9,488,416 B2 | 11/2016 | Englund et al. |
| 9,508,456 B1 | 11/2016 | Shim |
| 9,548,445 B2 | 1/2017 | Lee et al. |
| 9,553,102 B2 * | 1/2017 | Wang ............... H01L 27/11582 |
| 9,583,167 B2 | 2/2017 | Chung |
| 9,728,712 B2 | 8/2017 | Kardasz et al. |
| 9,741,926 B1 | 8/2017 | Pinarbasi et al. |
| 9,772,555 B2 | 9/2017 | Park et al. |
| 9,773,974 B2 | 9/2017 | Pinarbasi et al. |
| 9,853,006 B2 | 12/2017 | Avin et al. |
| 9,853,206 B2 | 12/2017 | Pinarbasi et al. |
| 9,853,292 B2 | 12/2017 | Loveridge et al. |
| 9,865,806 B2 | 1/2018 | Choi et al. |
| 10,026,609 B2 | 7/2018 | Sreenivasan et al. |
| 10,043,851 B1 | 8/2018 | Shen |
| 10,115,446 B1 | 10/2018 | Louie et al. |
| 2002/0057593 A1 | 5/2002 | Hidaka |
| 2002/0090533 A1 | 7/2002 | Zhang et al. |
| 2002/0105823 A1 | 8/2002 | Redon et al. |
| 2002/0132140 A1 | 9/2002 | Igarashi et al. |
| 2003/0085186 A1 | 5/2003 | Fujioka |
| 2003/0117840 A1 | 6/2003 | Sharma |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter |
| 2004/0026369 A1 | 2/2004 | Ying |
| 2004/0047179 A1 | 3/2004 | Chan |
| 2004/0061154 A1 | 4/2004 | Huai et al. |
| 2004/0094785 A1 | 5/2004 | Zhu et al. |
| 2004/0130936 A1 | 7/2004 | Nguyen et al. |
| 2004/0173315 A1 | 9/2004 | Leung |
| 2004/0197174 A1 | 10/2004 | Van Den Berg |
| 2004/0221030 A1 | 11/2004 | Huras |
| 2004/0257717 A1 | 12/2004 | Sharma et al. |
| 2005/0022746 A1 | 2/2005 | Lampe |
| 2005/0029551 A1 | 2/2005 | Atwood et al. |
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0160205 A1 | 7/2005 | Kuo |
| 2005/0174702 A1 | 8/2005 | Gill |
| 2005/0180202 A1 | 8/2005 | Huai |
| 2005/0184839 A1 | 8/2005 | Nguyen |
| 2005/0201023 A1 | 9/2005 | Huai et al. |
| 2005/0237787 A1 | 10/2005 | Huai et al. |
| 2005/0251628 A1 | 11/2005 | Jarvis et al. |
| 2005/0280058 A1 | 12/2005 | Pakala et al. |
| 2005/0285176 A1 | 12/2005 | Kim |
| 2006/0018057 A1 | 1/2006 | Huai |
| 2006/0049472 A1 | 3/2006 | Diao et al. |
| 2006/0077734 A1 | 4/2006 | Fong |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0198202 A1 | 9/2006 | Erez |
| 2006/0227465 A1 | 10/2006 | Inokuchi et al. |
| 2006/0271755 A1 | 11/2006 | Miura |
| 2006/0284183 A1 | 12/2006 | Izumi et al. |
| 2006/0291305 A1 | 12/2006 | Suzuki et al. |
| 2007/0019337 A1 | 1/2007 | Apalkov et al. |
| 2007/0094573 A1 | 4/2007 | Chen |
| 2007/0096229 A1 | 5/2007 | Yoshikawa |
| 2007/0220935 A1 | 9/2007 | Cernea |
| 2007/0226592 A1 | 9/2007 | Radke |
| 2007/0242501 A1 | 10/2007 | Hung et al. |
| 2007/0283313 A1 | 12/2007 | Ogawa et al. |
| 2007/0285972 A1 | 12/2007 | Horti |
| 2008/0049487 A1 | 2/2008 | Yoshimura |
| 2008/0049488 A1 | 2/2008 | Rizzo |
| 2008/0079530 A1 | 4/2008 | Weidman et al. |
| 2008/0112094 A1 | 5/2008 | Kent et al. |
| 2008/0144376 A1 | 6/2008 | Lee |
| 2008/0151614 A1 | 6/2008 | Guo |
| 2008/0181009 A1 | 7/2008 | Arai |
| 2008/0259508 A2 | 10/2008 | Kent et al. |
| 2008/0294938 A1 | 11/2008 | Kondo |
| 2008/0297292 A1 | 12/2008 | Viala et al. |
| 2009/0040825 A1 | 2/2009 | Adusumilli et al. |
| 2009/0046501 A1 | 2/2009 | Ranjan et al. |
| 2009/0072185 A1 | 3/2009 | Raksha et al. |
| 2009/0078927 A1 | 3/2009 | Xiao |
| 2009/0080267 A1 | 3/2009 | Bedeschi |
| 2009/0091037 A1 | 4/2009 | Assefa et al. |
| 2009/0098413 A1 | 4/2009 | Kanegae |
| 2009/0130779 A1 | 5/2009 | Li |
| 2009/0146231 A1 | 6/2009 | Kuper et al. |
| 2009/0161421 A1 | 6/2009 | Cho et al. |
| 2009/0209102 A1 | 8/2009 | Zhong et al. |
| 2009/0231909 A1 | 9/2009 | Dieny et al. |
| 2010/0039136 A1 | 2/2010 | Chua-Eoan |
| 2010/0080040 A1 | 4/2010 | Choi |
| 2010/0087048 A1 | 4/2010 | Izumi et al. |
| 2010/0110803 A1 | 5/2010 | Arai |
| 2010/0124091 A1 | 5/2010 | Cowburn |
| 2010/0162065 A1 | 6/2010 | Norman |
| 2010/0193891 A1 | 8/2010 | Wang et al. |
| 2010/0195362 A1 | 8/2010 | Norman |
| 2010/0195401 A1 | 8/2010 | Jeong et al. |
| 2010/0227275 A1 | 9/2010 | Nozaki |
| 2010/0232206 A1 | 9/2010 | Li |
| 2010/0246254 A1 | 9/2010 | Prejbeanu et al. |
| 2010/0248154 A1 | 9/2010 | Nozaki |
| 2010/0254181 A1 | 10/2010 | Chung |
| 2010/0271090 A1 | 10/2010 | Rasmussen |
| 2010/0271870 A1 | 10/2010 | Zheng et al. |
| 2010/0277976 A1 | 11/2010 | Oh |
| 2010/0290275 A1 | 11/2010 | Park |
| 2010/0311243 A1 | 12/2010 | Mao |
| 2011/0001108 A1 | 1/2011 | Greene |
| 2011/0032645 A1 | 2/2011 | Noel et al. |
| 2011/0058412 A1 | 3/2011 | Zheng et al. |
| 2011/0061786 A1 | 3/2011 | Mason |
| 2011/0076620 A1 | 3/2011 | Nozaki |
| 2011/0089511 A1 | 4/2011 | Keshtbod et al. |
| 2011/0133298 A1 | 6/2011 | Chen et al. |
| 2011/0283135 A1 | 11/2011 | Burger |
| 2011/0310591 A1 | 12/2011 | Zhou et al. |
| 2011/0320696 A1 | 12/2011 | Fee et al. |
| 2012/0028373 A1 | 2/2012 | Beim |
| 2012/0052258 A1 | 3/2012 | Op Debeeck et al. |
| 2012/0069649 A1 | 3/2012 | Ranjan et al. |
| 2012/0127804 A1 | 5/2012 | Ong et al. |
| 2012/0155156 A1 | 6/2012 | Watts |
| 2012/0155158 A1 | 6/2012 | Higo |
| 2012/0163113 A1 | 6/2012 | Hatano et al. |
| 2012/0181642 A1 | 7/2012 | Prejbeanu et al. |
| 2012/0188818 A1 | 7/2012 | Ranjan et al. |
| 2012/0221905 A1 | 8/2012 | Burger |
| 2012/0228728 A1 | 9/2012 | Ueki et al. |
| 2012/0239969 A1 | 9/2012 | Dickens |
| 2012/0254636 A1 | 10/2012 | Tsukamoto et al. |
| 2012/0280336 A1 | 11/2012 | Jan |
| 2012/0280339 A1 | 11/2012 | Zhang et al. |
| 2012/0294078 A1 | 11/2012 | Kent et al. |

(56) References Cited

U.S. PATENT DOCUMENTS

| | | |
|---|---|---|
| 2012/0299133 A1 | 11/2012 | Son et al. |
| 2012/0324274 A1 | 12/2012 | Hori |
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0039119 A1 | 2/2013 | Rao |
| 2013/0044537 A1 | 2/2013 | Ishigaki |
| 2013/0075845 A1 | 3/2013 | Chen et al. |
| 2013/0107633 A1 | 5/2013 | Kim |
| 2013/0244344 A1 | 9/2013 | Malmhall |
| 2013/0267042 A1 | 10/2013 | Satoh et al. |
| 2013/0270523 A1 | 10/2013 | Wang et al. |
| 2013/0270661 A1 | 10/2013 | Yi et al. |
| 2013/0275691 A1 | 10/2013 | Chew |
| 2013/0307097 A1 | 11/2013 | Yi et al. |
| 2013/0341801 A1 | 12/2013 | Satoh et al. |
| 2014/0009994 A1 | 1/2014 | Parkin et al. |
| 2014/0036573 A1 | 2/2014 | Ishihara |
| 2014/0042571 A1 | 2/2014 | Gan et al. |
| 2014/0048896 A1 | 2/2014 | Huang et al. |
| 2014/0063949 A1 | 3/2014 | Tokiwa |
| 2014/0070341 A1 | 3/2014 | Beach et al. |
| 2014/0089762 A1 | 3/2014 | Pangal et al. |
| 2014/0103469 A1 | 4/2014 | Jan |
| 2014/0103472 A1 | 4/2014 | Kent et al. |
| 2014/0136870 A1 | 5/2014 | Breternitz et al. |
| 2014/0149827 A1 | 5/2014 | Kim et al. |
| 2014/0151837 A1 | 6/2014 | Ryu |
| 2014/0169085 A1 | 6/2014 | Wang et al. |
| 2014/0177316 A1 | 6/2014 | Otsuka et al. |
| 2014/0217531 A1 | 8/2014 | Jan |
| 2014/0219034 A1 | 8/2014 | Gomez et al. |
| 2014/0252439 A1 | 9/2014 | Guo |
| 2014/0264671 A1 | 9/2014 | Chepulskyy et al. |
| 2014/0269005 A1 | 9/2014 | Kang |
| 2014/0281284 A1 | 9/2014 | Block et al. |
| 2014/0289358 A1 | 9/2014 | Lindamood |
| 2014/0321196 A1 | 10/2014 | Ikeda |
| 2015/0056368 A1 | 2/2015 | Wang et al. |
| 2015/0098287 A1 | 4/2015 | Lee |
| 2015/0100848 A1 | 4/2015 | Kalamatianos |
| 2015/0135039 A1 | 5/2015 | Mekhanik et al. |
| 2015/0143343 A1 | 5/2015 | Weiss |
| 2015/0154116 A1 | 6/2015 | Dittrich |
| 2015/0171316 A1 | 6/2015 | Park et al. |
| 2015/0206568 A1 | 7/2015 | Bose et al. |
| 2015/0206569 A1 | 7/2015 | Bose et al. |
| 2015/0242269 A1 | 8/2015 | Pelley et al. |
| 2015/0262701 A1 | 9/2015 | Takizawa |
| 2015/0278011 A1 | 10/2015 | Keppel et al. |
| 2015/0279904 A1 | 10/2015 | Pinarbasi et al. |
| 2015/0378814 A1 | 12/2015 | Webb et al. |
| 2015/0380088 A1 | 12/2015 | Naeimi et al. |
| 2016/0027525 A1 | 1/2016 | Kim et al. |
| 2016/0027999 A1* | 1/2016 | Pinarbasi ............... H01L 43/02 438/3 |
| 2016/0043304 A1 | 2/2016 | Chen |
| 2016/0056072 A1 | 2/2016 | Arvin et al. |
| 2016/0085443 A1 | 3/2016 | Tomishima et al. |
| 2016/0085621 A1 | 3/2016 | Motwani |
| 2016/0085692 A1 | 3/2016 | Kwok |
| 2016/0086600 A1 | 3/2016 | Bauer et al. |
| 2016/0087193 A1 | 3/2016 | Yoha |
| 2016/0093798 A1 | 3/2016 | Kim et al. |
| 2016/0111634 A1 | 4/2016 | Lee et al. |
| 2016/0118249 A1 | 4/2016 | Sreenivasan et al. |
| 2016/0124299 A1 | 5/2016 | Yu et al. |
| 2016/0126201 A1 | 5/2016 | Arvin et al. |
| 2016/0126452 A1 | 5/2016 | Kuo et al. |
| 2016/0126453 A1 | 5/2016 | Chen |
| 2016/0148685 A1 | 5/2016 | Roy |
| 2016/0163965 A1 | 6/2016 | Han et al. |
| 2016/0163973 A1 | 6/2016 | Pinarbasi |
| 2016/0181508 A1 | 6/2016 | Lee et al. |
| 2016/0218278 A1 | 7/2016 | Pinarbasi et al. |
| 2016/0260486 A1 | 9/2016 | Tani |
| 2016/0268499 A1* | 9/2016 | You .................... H01L 43/12 |
| 2016/0283385 A1 | 9/2016 | Boyd et al. |
| 2016/0284762 A1 | 9/2016 | Wang |
| 2016/0300615 A1 | 10/2016 | Lee |
| 2016/0307860 A1 | 10/2016 | Arvin et al. |
| 2016/0315118 A1 | 10/2016 | Kardasz et al. |
| 2016/0315249 A1 | 10/2016 | Kardasz et al. |
| 2016/0315259 A1 | 10/2016 | Fennimore et al. |
| 2016/0358778 A1 | 12/2016 | Park et al. |
| 2016/0372656 A1 | 12/2016 | Pinarbasi et al. |
| 2016/0378592 A1 | 12/2016 | Ikegami et al. |
| 2017/0025472 A1 | 1/2017 | Kim et al. |
| 2017/0033156 A1 | 2/2017 | Gan et al. |
| 2017/0033283 A1 | 2/2017 | Pinarbasi et al. |
| 2017/0047107 A1 | 2/2017 | Berger et al. |
| 2017/0062712 A1 | 3/2017 | Choi et al. |
| 2017/0069837 A1 | 3/2017 | Choi et al. |
| 2017/0084826 A1 | 5/2017 | Zhou et al. |
| 2017/0123991 A1 | 5/2017 | Sela et al. |
| 2017/0133104 A1 | 5/2017 | Darbari et al. |
| 2017/0199459 A1 | 7/2017 | Ryu et al. |
| 2017/0222132 A1 | 8/2017 | Pinarbasi et al. |
| 2017/0270988 A1 | 9/2017 | Ikegami |
| 2018/0018134 A1 | 1/2018 | Kang |
| 2018/0019343 A1 | 1/2018 | Asami |
| 2018/0033957 A1 | 2/2018 | Zhang |
| 2018/0097175 A1 | 4/2018 | Chuang |
| 2018/0114589 A1 | 4/2018 | El-Baraji et al. |
| 2018/0119278 A1 | 5/2018 | Kornmeyer |
| 2018/0121117 A1 | 5/2018 | Berger et al. |
| 2018/0121355 A1 | 5/2018 | Berger et al. |
| 2018/0121361 A1 | 5/2018 | Berger et al. |
| 2018/0122446 A1 | 5/2018 | Berger et al. |
| 2018/0122447 A1 | 5/2018 | Berger et al. |
| 2018/0122448 A1 | 5/2018 | Berger et al. |
| 2018/0122449 A1 | 5/2018 | Berger et al. |
| 2018/0122450 A1 | 5/2018 | Berger et al. |
| 2018/0130945 A1 | 5/2018 | Choi et al. |
| 2018/0211821 A1 | 7/2018 | Kogler |
| 2018/0233362 A1 | 8/2018 | Glodde |
| 2018/0233363 A1 | 8/2018 | Glodde |
| 2018/0248110 A1 | 8/2018 | Kardasz et al. |
| 2018/0248113 A1 | 8/2018 | Pinarbasi et al. |
| 2018/0331279 A1 | 11/2018 | Shen et al. |

FOREIGN PATENT DOCUMENTS

| | | |
|---|---|---|
| EP | 1345277 | 9/2003 |
| FR | 2817998 | 6/2002 |
| FR | 2832542 | 5/2003 |
| FR | 2910716 | 6/2008 |
| JP | H10-004012 | 1/1998 |
| JP | H11-120758 | 4/1999 |
| JP | H11-352867 | 12/1999 |
| JP | 2001-195878 | 7/2001 |
| JP | 2002-261352 | 9/2002 |
| JP | 2002-357489 | 12/2002 |
| JP | 2003-318461 | 11/2003 |
| JP | 2005-044848 | 2/2005 |
| JP | 2005-150482 | 6/2005 |
| JP | 2005-535111 | 11/2005 |
| JP | 2006128579 | 5/2006 |
| JP | 2008-524830 | 7/2008 |
| JP | 2009-027177 | 2/2009 |
| JP | 2013-012546 | 1/2013 |
| JP | 2014-039061 | 2/2014 |
| JP | 5635666 | 12/2014 |
| JP | 2015-002352 | 1/2015 |
| KR | 10-2014-015246 | 9/2014 |
| WO | 2009-080636 | 7/2009 |
| WO | 2011-005484 | 1/2011 |
| WO | 2014-062681 | 4/2014 |

OTHER PUBLICATIONS

US 2016/0218273 A1, 07/2016, Pinarbasi (withdrawn)

(56) References Cited

OTHER PUBLICATIONS

Bhatti Sabpreet et al., "Spintronics Based Random Access Memory; a Review,"Material Today, Nov. 2107, pp. 530-548, vol. 20, No. 9, Elsevier,.
Helia Naeimi, et al., "STTRAM Scaling and Retention Failure,"Intel Technology Journal, vol. 17, Issue 1, 2013, pp. 54-75 (22 pages).
S. Ikeda, et al., "A Perpendicular-Anisotropy CoFeB-MgO Magnetic Tunnel Junction", Nature Materials, vol. 9, Sep. 2010, pp. 721-724 (4 pages).
R.H. Kock, et al., "Thermally Assisted Magnetization Reversal in Submicron-Sized Magnetic Thin Films", Physical Review Letters, The American Physical Society, vol. 84, No. 23, Jun. 5. 2000, pp. 5419-5422 (4 pages).
K.J. Lee, et al., "Analytical Investigation of Spin-Transfer Dynamics Using a Perpendicular-to-Plane Polarizer", Applied Physics Letters, American Insitute of Physics, vol. 86, (2005), pp. 022505-1 to 022505-3 (3 pages).
Kirsten Martens, et al., "Thermally Induced Magnetic switching in Thin Ferromagnetic Annuli", NSF grants PHY-0351964 (DLS). 2005, 11 pages.
Kristen Martens, et al., "Magnetic Reversal in Nanoscropic Ferromagnetic Rings", NSF grants PHY-0351964 (DLS) 2006, 23 pages.
"Magnetic Technology Spintronics, Media and Interface", Data Storage Institute, R&D Highlights, Sep. 2010, 3 pages.
Daniel Scott Matic, "A Magnetic Tunnel Junction Compact Model for STT-RAM and MeRAM", Master Thesis University of California, Los Angeles, 2013, pp. 43.

\* cited by examiner

METHODS OF MANUFACTURING MAGNETIC TUNNEL JUNCTION DEVICES

BACKGROUND OF THE INVENTION

Computing systems have made significant contributions toward the advancement of modern society and are utilized in a number of applications to achieve advantageous results. Numerous devices, such as desktop personal computers (PCs), laptop PCs, tablet PCs, netbooks, smart phones, game consoles, servers, distributed computing systems, and the like have facilitated increased productivity and reduced costs in communicating and analyzing data in most areas of entertainment, education, business, and science. One common aspect of computing systems is the computing device readable memory. Computing devices may include one or more types of memory, such as volatile random-access memory, non-volatile flash memory, and the like.

An emerging non-volatile memory technology is Magnetoresistive Random Access Memory (MRAM). In MRAM devices, data can be stored in the magnetization orientation between ferromagnetic layers of a Magnetic Tunnel Junction (MTJ). The MTJ can include two magnetic layers and a magnetic tunnel barrier layer. One of the magnetic layers can have a fixed magnetization polarization, while the polarization of the magnetization of the other magnetic layer can switch between opposite directions. Typically, if the magnetic layers have the same magnetization polarization, the MTJ cell will exhibit a relatively low resistance value corresponding to a '1' bit state; while if the magnetization polarization between the two magnetic layers is antiparallel the MTJ cell will exhibit a relatively high resistance value corresponding to a '0' bit state. Because the data is stored in the magnetic fields, MRAM devices are non-volatile memory devices. The state of a MRAM cell can be read by applying a predetermined current through the cell and measuring the resulting voltage, or by applying a predetermined voltage across the cell and measuring the resulting current. The sensed current or voltage is proportional to the resistance of the cell and can be compared to a reference value to determine the state of the cell.

MRAM devices are characterized by densities similar to Dynamic Random-Access Memory (DRAM), power consumption similar to flash memory, and speed similar to Static Random-Access Memory (SRAM). Although MRAM devices exhibit favorable performance characteristics as compared to other memory technologies, there is a continuing need for improved MRAM device and methods of manufacture thereof.

SUMMARY OF THE INVENTION

The present technology may best be understood by referring to the following description and accompanying drawings that are used to illustrate embodiments of the present technology directed toward method of manufacturing Magnetic Tunnel Junction (MTJ) device.

In one embodiment, the method of manufacturing can include forming a static magnetic compensation layer on a free magnetic layer. The static magnetic compensation layer can be configured to compensate for one or more parasitic magnetic characteristics proximate the free magnetic layer. A hard mask capping layer can be formed on the static magnetic compensation layer, and a pillar mask can be formed on the hard mask capping layer. The hard mask capping layer and the static magnetic compensation layer exposed by the pillar mask can be selective etched to form portions of MTJ pillars. A conformal first insulating layer can be formed and etched to form first sidewall insulators self-aligned to the MTJ pillars. A first metal layer and a conformal second insulating layers can be formed. The conformal second insulating layer can be etched to form second sidewall insulators self-aligned to the MTJ pillars. The first metal layer and the free magnetic layer can be selectively etched to form MTJ pillars including pillar contacts coupled to the free magnetic layer.

In another embodiment, the method of manufacturing can include forming an exchange spring layer on a free magnetic layer. The exchange spring layer can be configured to maintain a magnetic state of the free magnetic layer. A hard mask capping layer can be formed on the exchange spring layer, and a pillar mask can be formed on the hard mask capping layer. The hard mask capping layer and the exchange layer exposed by the pillar mask can be selectively etched to form portions of MTJ pillars. A conformal first insulating layer can be formed and etched to form first sidewall insulators self-aligned to the MTJ pillars. A first metal layer and a conformal second insulating layers can be formed. The conformal second insulating layer can be etched to form second sidewall insulators self-aligned to the MTJ pillars. The first metal layer and the free magnetic layer can be selective etched to form MTJ pillars including pillar contacts coupled to the free magnetic layer.

The static magnetic compensation layer or the exchange spring layer can be utilized optimize the MTJ device. The pillar contacts can provide electrical coupling between the free magnetic layer and the top contact so that the static magnetic compensation layer or the exchange spring layer does not impact the over electrical resistance of the device.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Figure 1A:
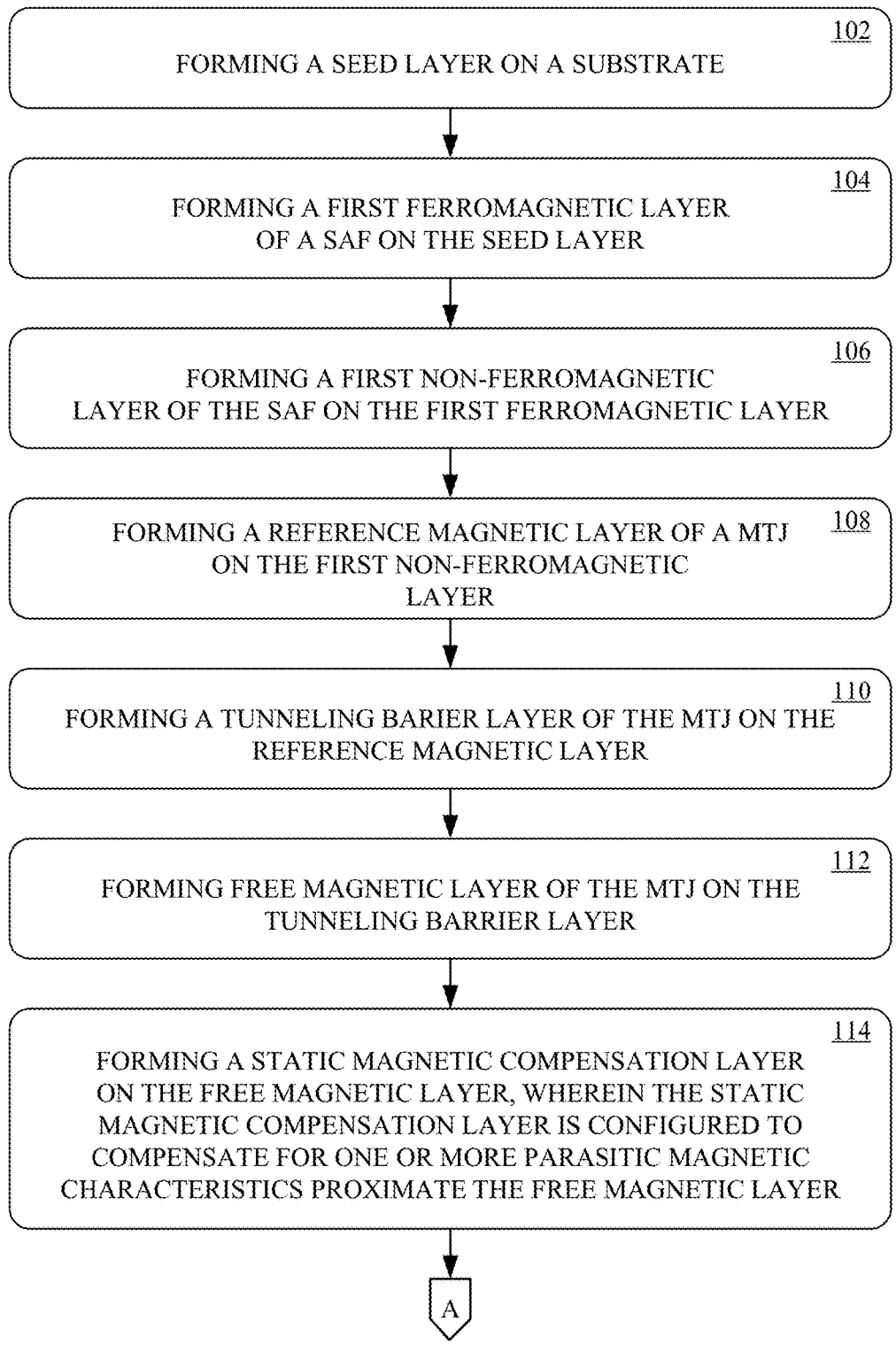
FIGS. 1A-1D show a flow diagram of a method of fabricating Magnetic Tunnel Junction (MTJ) device, in accordance with an embodiment of the present technology.
Figure 1B:
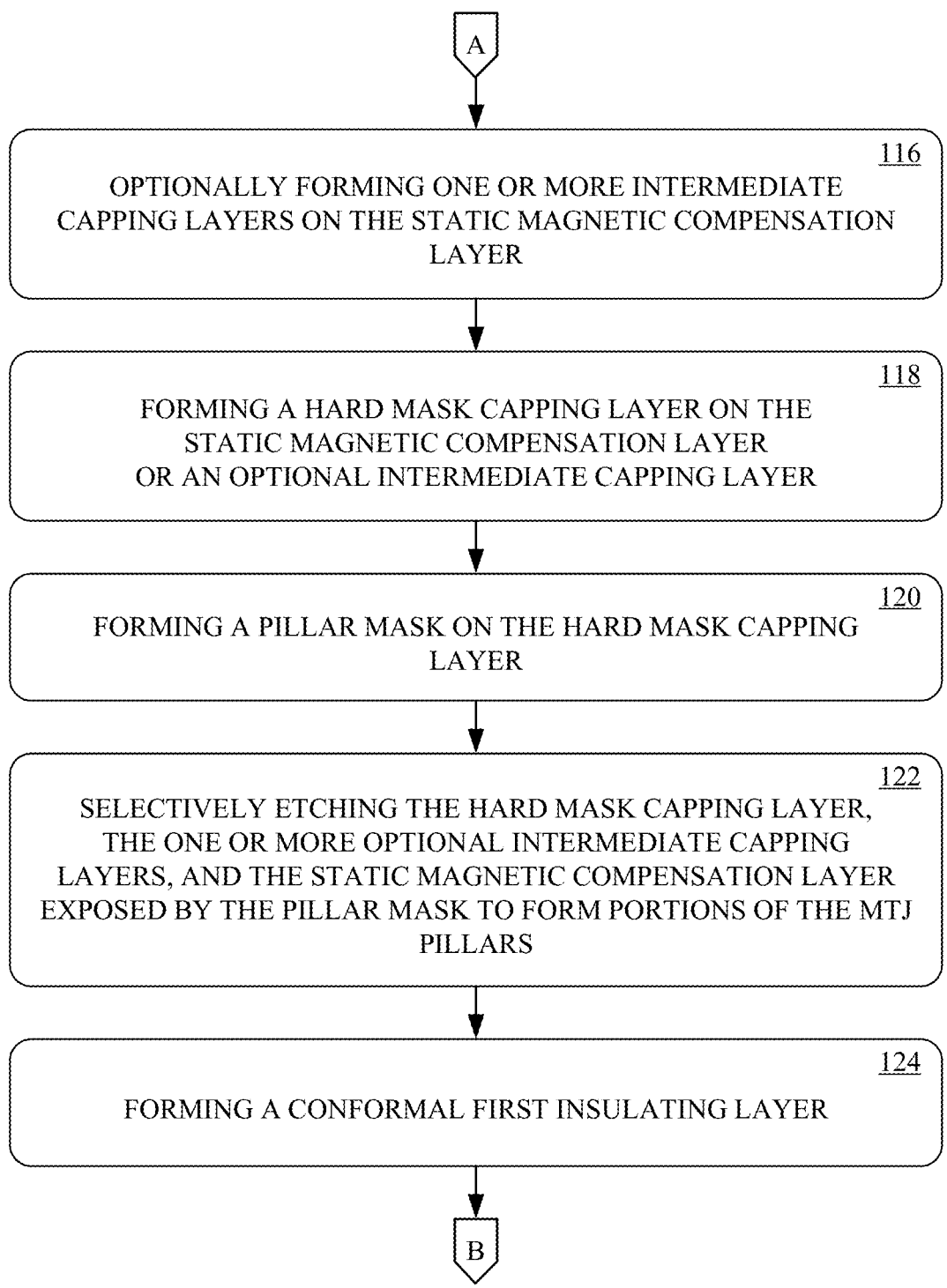
Figure 1C:
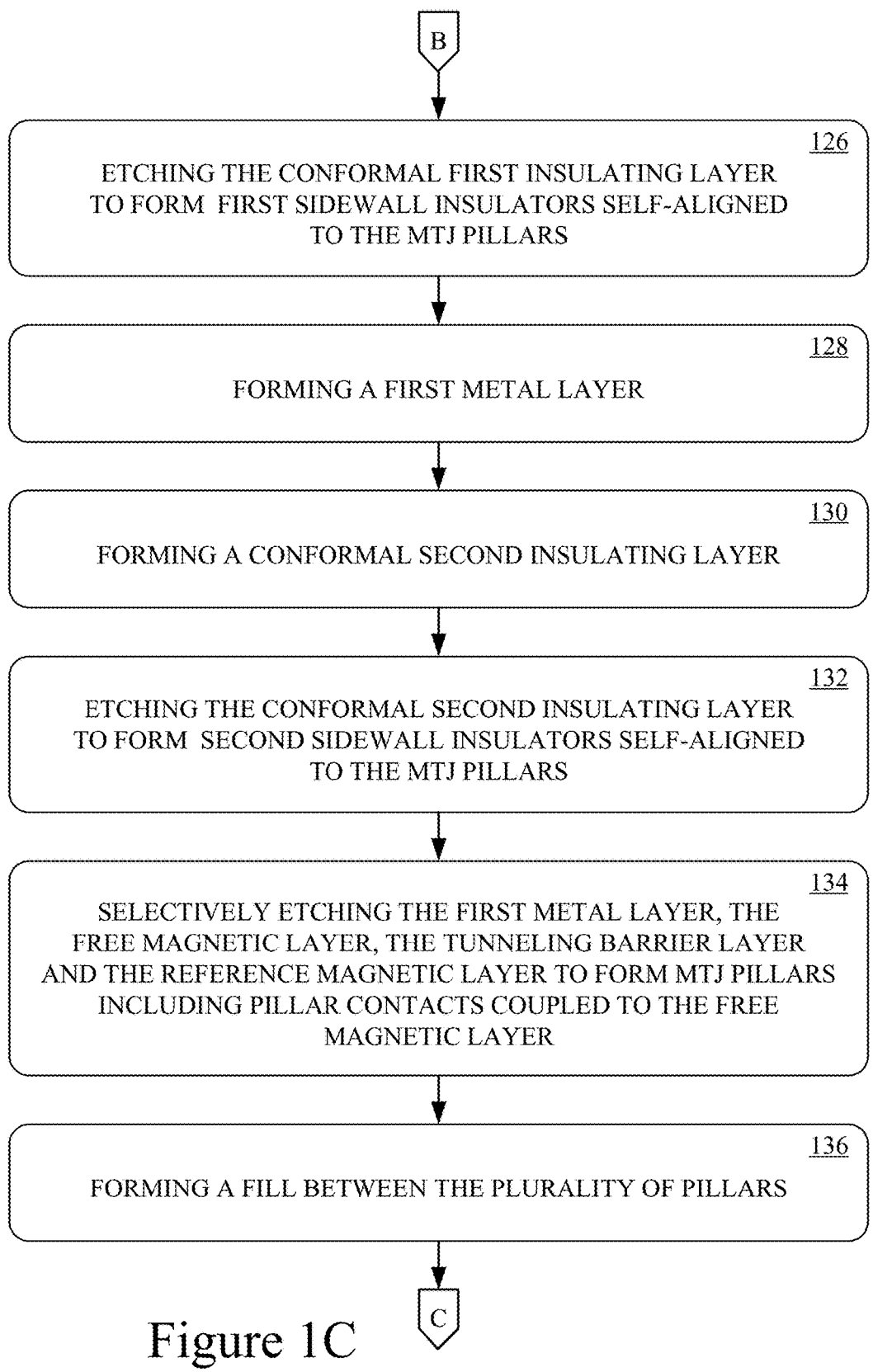
Figure 1D:
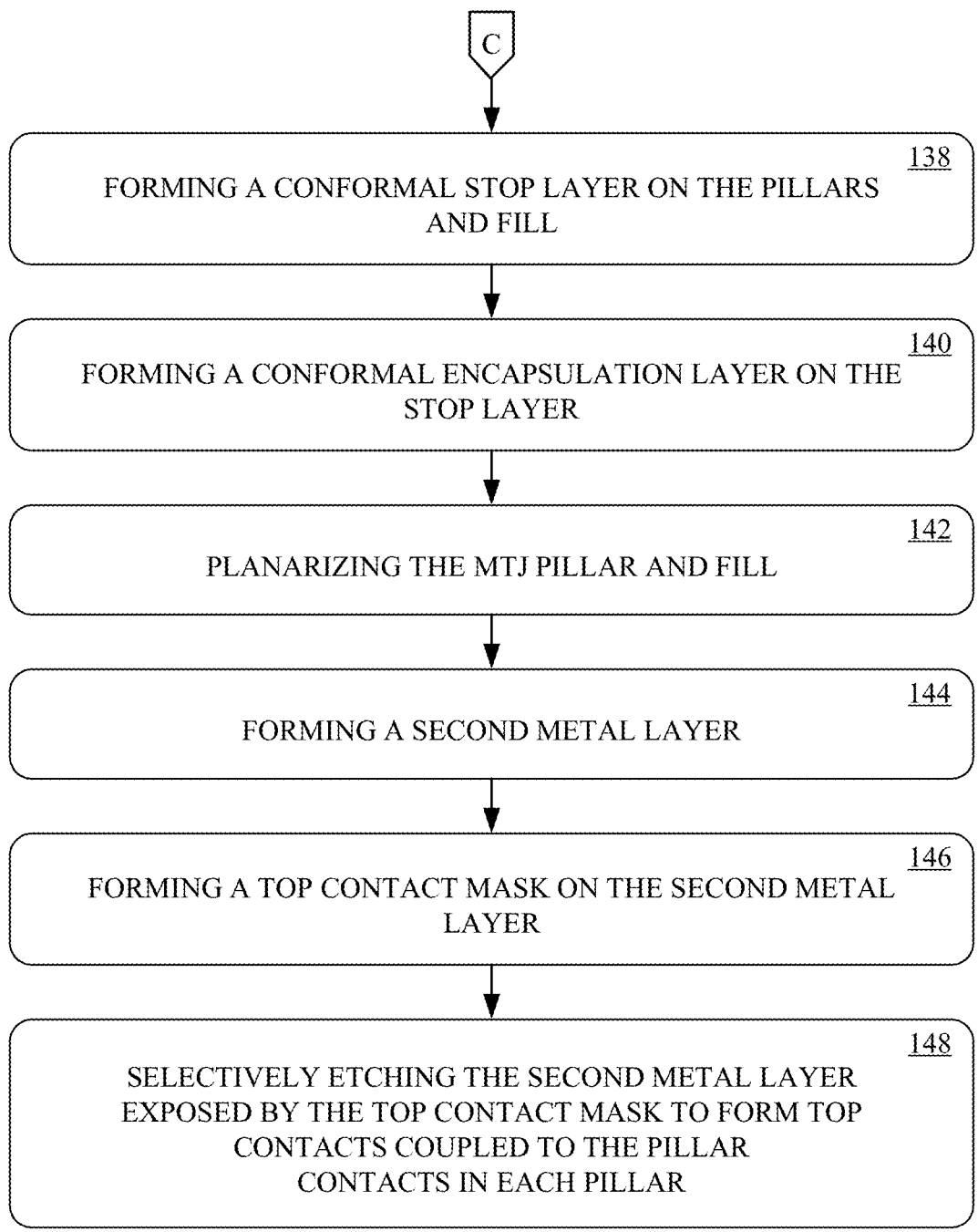

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

Referring to FIGS. 1A-1D, a flow diagram of a method of fabricating Magnetic Tunnel Junction (MTJ) device, in accordance with an embodiment of the present technology, is shown. The method will be further described with reference to FIGS. 2A-2K, which show a block diagram illustrating fabrication of the MTJ device. In one aspect, a seed layer 202 on a substrate 204, at 102. The seed layer 202 can be deposited on the substrate 202 to initiate a predetermined crystalline growth in one or more subsequent deposited layers. In one implementation, the seed layer 202 can include one or more layers of Tantalum (Ta) with a thickness of approximately 1-20 nanometers (nm). In one instance the Tantalum (Ta) layer can be 5 nm thick.

In one aspect, a first ferromagnetic layer 206 can be formed on the seed layer 204, at 104. In one implementation, the first ferromagnetic layer 206 can include one or more layers of a Cobalt-Iron (Co—Fe), Cobalt Nickel (CoNi), or Cobalt Platinum (CoPt) alloy with a thickness of approximately 5-15 nm. At 106, a first non-magnetic layer 208 can be formed on the first ferromagnetic layer 206. In one implementation, the first non-magnetic layer 208 can include one or more layers of a Ruthenium (Ru) alloy with a thickness of approximately 30-100 nm. The first ferromagnetic layer 206, the first non-magnetic layer 208, and a subsequently described reference magnetic layer 210 can form a Synthetic Antiferromagnetic (SAF) 206-210 of the MTJ device.

In one aspect, a reference magnetic layer 210 can be formed on the first non-magnetic layer 208, at 108. In one implementation, the reference magnetic layer 210 can include one or more layers of a Cobalt-Iron-Boron (Co—Fe—B) alloy with a thickness of approximately 1-5 nm. At 110, a tunneling barrier layer 212 can be formed on the reference magnetic layer 210. In one implementation, the tunneling barrier layer 212 can include one or more layers of a Ruthenium (Ru) alloy with a thickness of approximately 0.1-1 nm. At 112, a free magnetic layer 214 can be formed on the non-magnetic tunneling barrier layer 212. In one implementation, the free magnetic layer 214 can include one or more layers of a Cobalt-Iron-Boron (Co—Fe—B) alloy with a thickness of approximately 0.5-2 nm.

In one aspect, the reference magnetic layer 210 can have its magnetization pinned in a predetermined direction, meaning that the reference magnetic layer 210 has a higher coercivity than other layers and a larger magnetic field or spin-polarized current is needed to change the orientation of its magnetization. The magnetization direction of the free magnetic layer 214 can be changed by a smaller magnetic field or sin-polarized current relative to the reference magnetic layer 210. In one implementation, the magnetization vector of the first ferromagnetic layer 206 and the reference magnetic layer 210 can be substantially perpendicular (e.g., within several degrees) to a plane of the layers (e.g., along a z-axis). The magnetization vector of the free magnetic layer 214 can also be substantially perpendicular to the plane of the layer (e.g., along a z-axis), but its direction can vary by 180 degrees.

In one aspect, a static magnetic compensation layer 216 can be formed on the free magnetic layer 214, at 114. The static magnetic compensation layer 216 can be a permanent magnet configured to provide a magnetic field in the free magnetic layer 214 that compensates for one or more parasitic magnetic fields in the free magnetic layer 214. In one implementation, the static magnetic compensation layer 216 can be configured to partially compensate for, balance out, or over compensate for the one or more parasitic magnetic field in the free magnetic layer 214. In one implementation, the static magnetic compensation layer can be Cobalt Platinum (CoPt) or Cobalt Iron (CoFe) with a thickness of approximately 0.5-5 nm.

In one aspect, one or more intermediate capping layers (not shown) can optionally be formed on the static magnetic compensation layer 216, at 116. The one or more intermediate capping layers formed on the static magnetic compensation layer can include one or more Perpendicular Magnetic Anisotropy (PMA) enhancement layers. Optionally, one or more intermediate capping layers can be formed between the free magnetic layer 214 and the static magnetic compensation layer 216. In another option, one or more intermediate capping layers can be formed between the free magnetic layer 214 and the static magnetic compensation layer 216, and one or more other intermediate capping layers can be formed on the static magnetic compensation layer 216. The one or more intermediate capping layers formed between the free magnetic layer 214 and the static magnetic compensation layer 216, or on the static magnetic compensation layer 216 can include one or more Processional Spin Current (PSC) coupling layers, one or more Perpendicular Magnetic Anisotropy (PMA) enhancement layers, one or more PSC magnetic layers, or combinations of thereof. In one aspect, a hard mask capping layer 218 can be formed on the static magnetic compensation layer 216 or an optional intermediate capping layer, at 118. In one implementation, the hard mask capping layer can be a Silicon Oxide (SiOx), a Silicon Nitride (SiNx) or Aluminum Oxide (AlOx) with a thickness of approximately 5-20 nm.

Figure 2A:
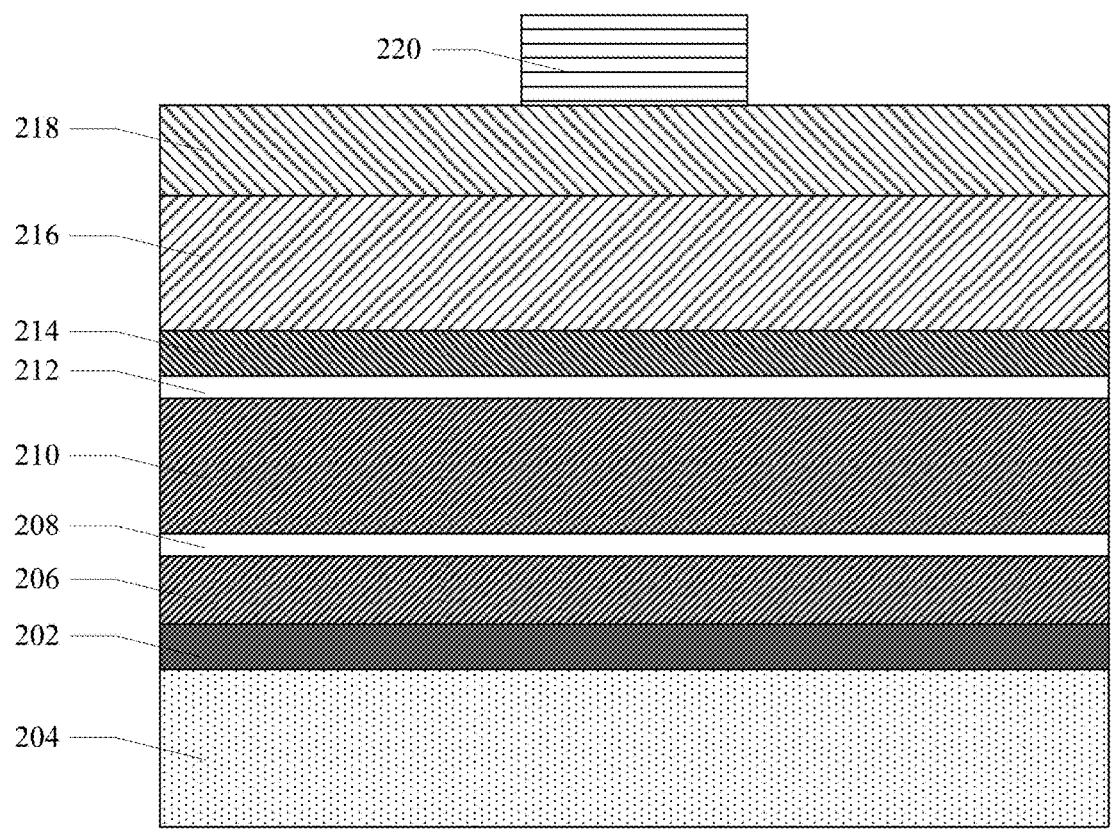
FIGS. 2A-2K show a block diagram illustrating fabrication of a MTJ device, in accordance with an embodiment of the present technology.
Figure 2B:
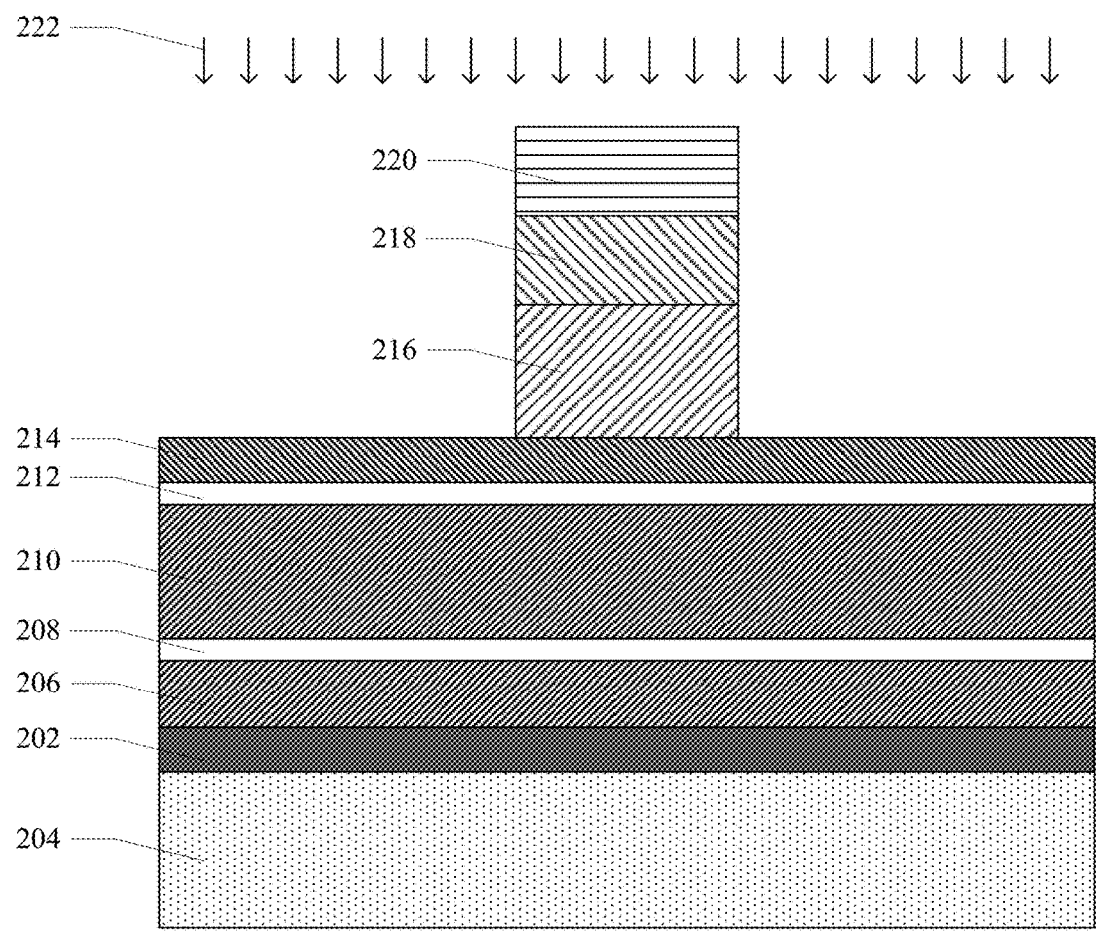
Figure 2C:
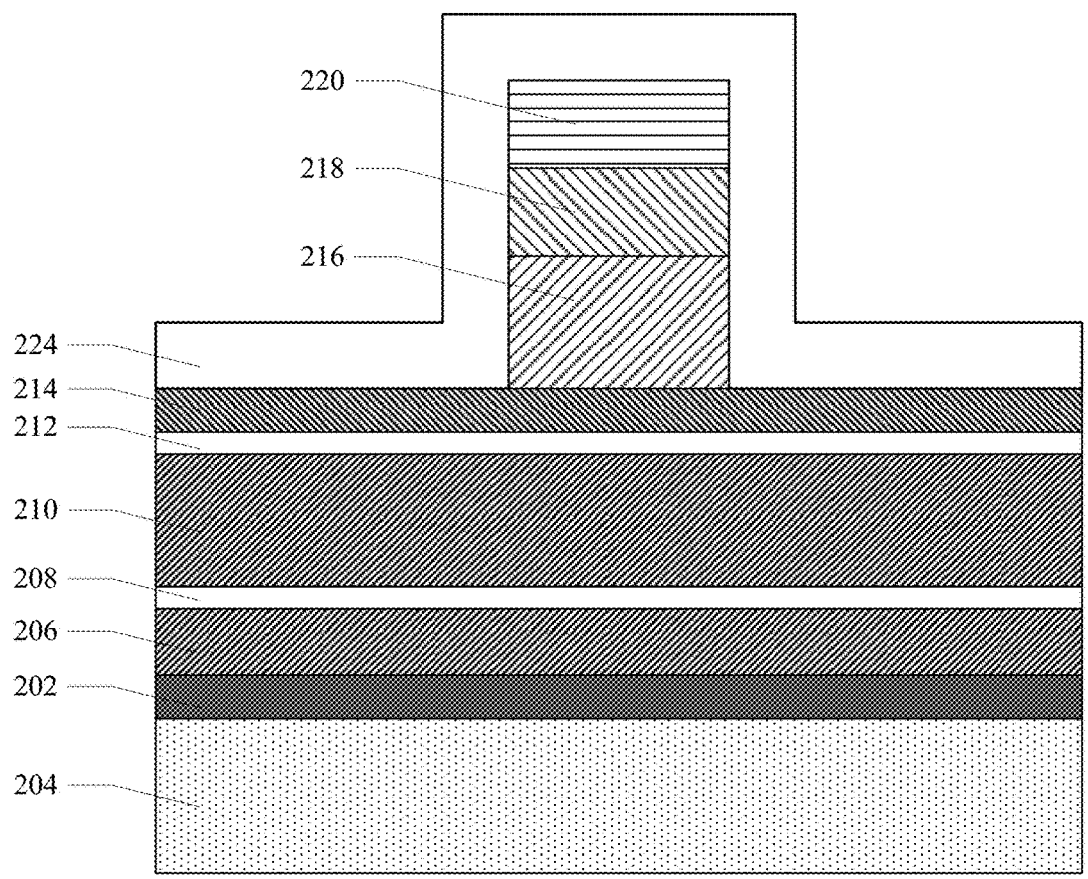

In one aspect, a pillar mask 220 can be formed on the hard mask capping layer 218, at 120. In one implementation, the pillar mask 220 can be formed utilizing conventional photolithography masking processes. In one aspect, the hard mask capping layer 218, the one or more optional intermediate capping layers if included, and the static magnetic compensation layer 216 exposed by the pillar mask 220 can be selective etched 222 by one or more processes to form a first portion of MTJ pillars, at 122. The selective etching 222 can be performed until the free magnetic layer 214 between the first portion of the MTJ pillars is exposed, as illustrated in FIG. 2B. One or more etching processes appropriate for the different materials of the hard mask capping layer 218, the one or more optional intermediate capping layers if included, and the static magnetic compensation layer 216 can be used. In one implementation, the hard mask capping layer 218 can be reactive ion etched. The one or more optional intermediate capping layers if included, and the static magnetic compensation layer 216 can be ion beam etched.

In one aspect, a conformal first insulating layer 224 can be formed, at 124. In one implementation, the conformal first insulating layer 224 can be silicon dioxide (SiO$_2$), silicon nitride (SiN), or the like with a thickness of approximately 5-10 nm. The conformal first insulating layer 224 can be deposited by Atomic Layer Deposition (ALD), Physical Vapor Deposition (PVD) or Plasma Enhanced Chemical Vapor Deposition on the first portion of the MTJ pillars and the exposed portions of the free magnetic layer 214.

Figure 2D:
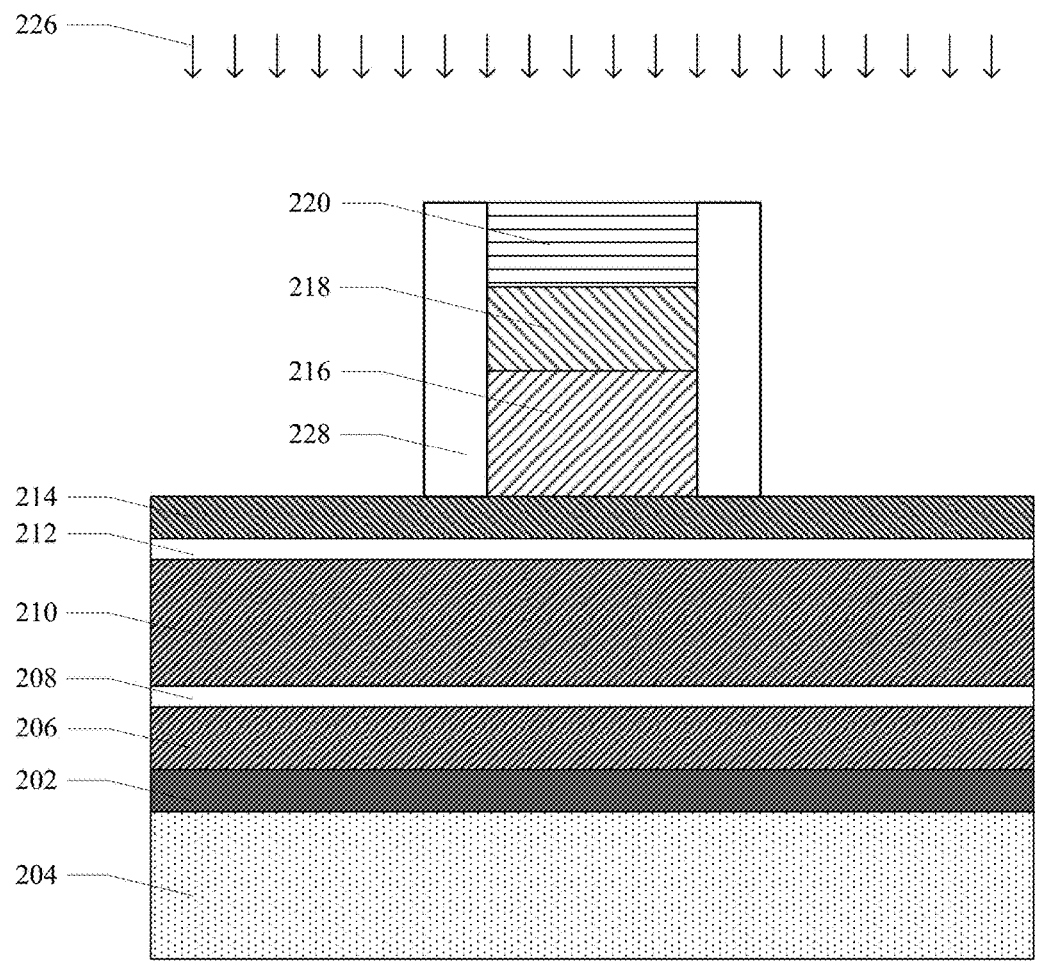
Figure 2E:
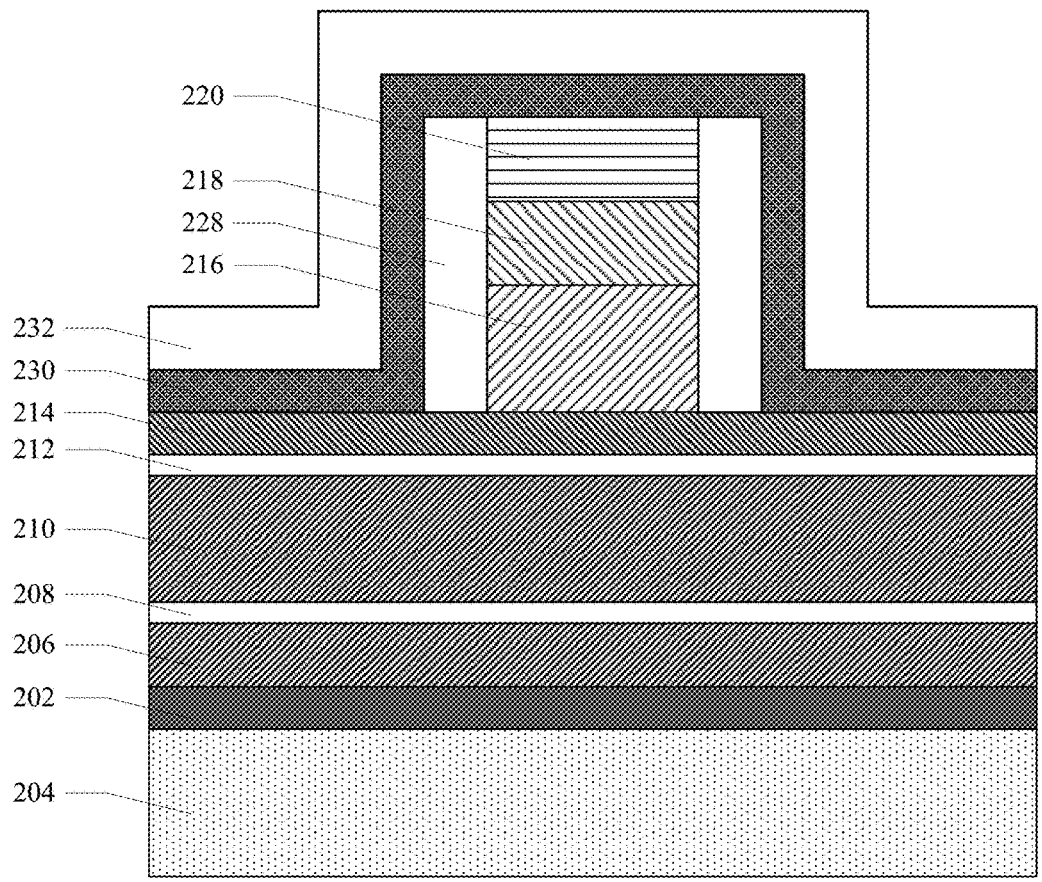
Figure 2F:
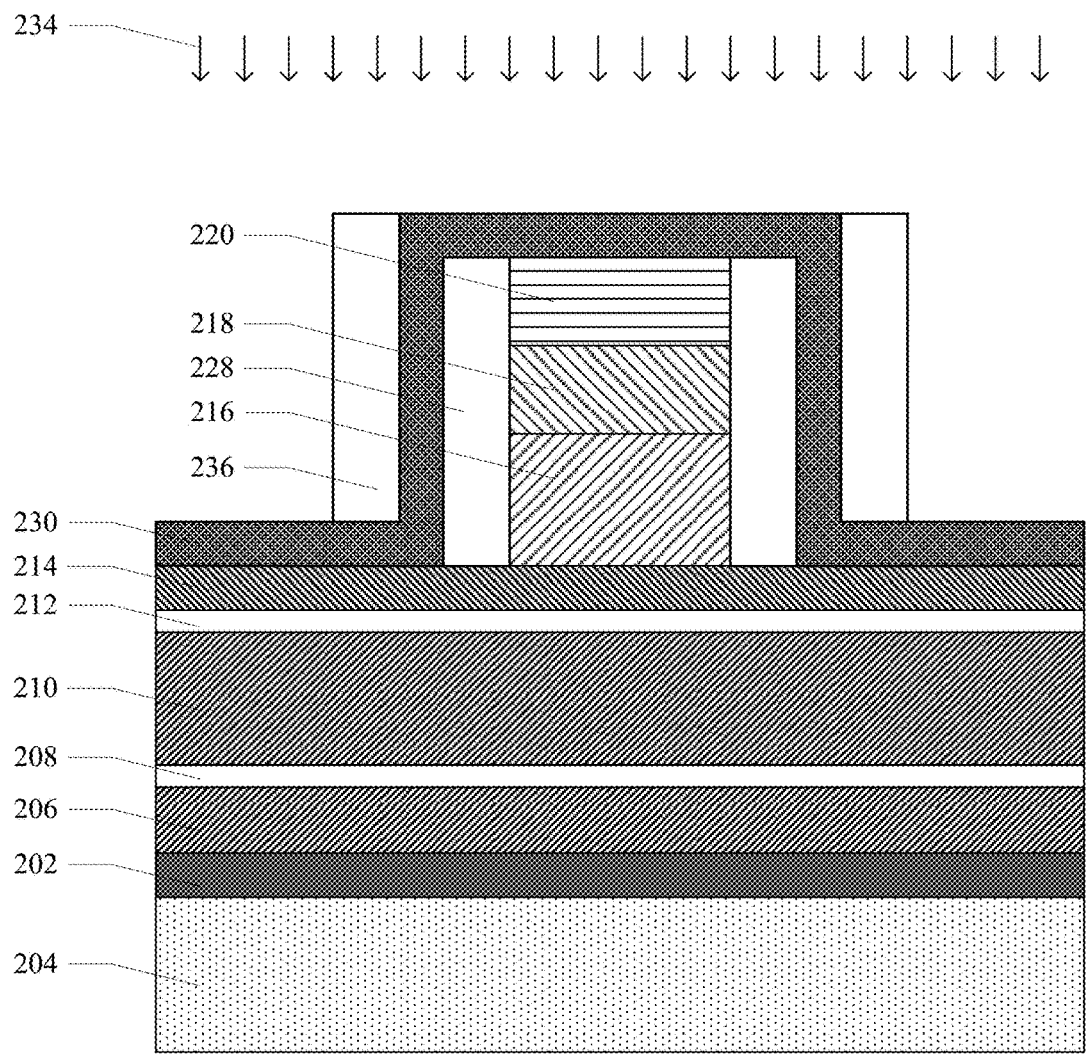
Figure 2G:
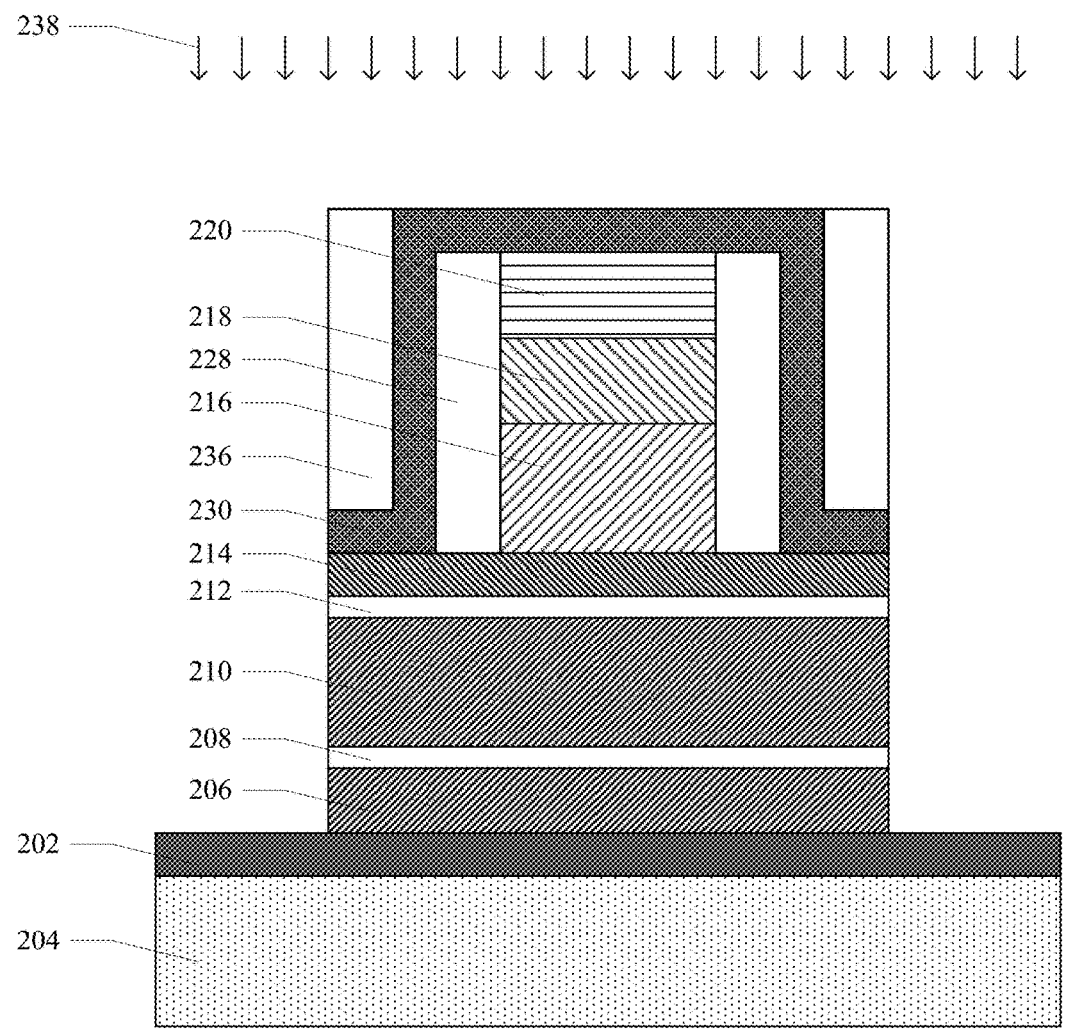
Figure 2H:
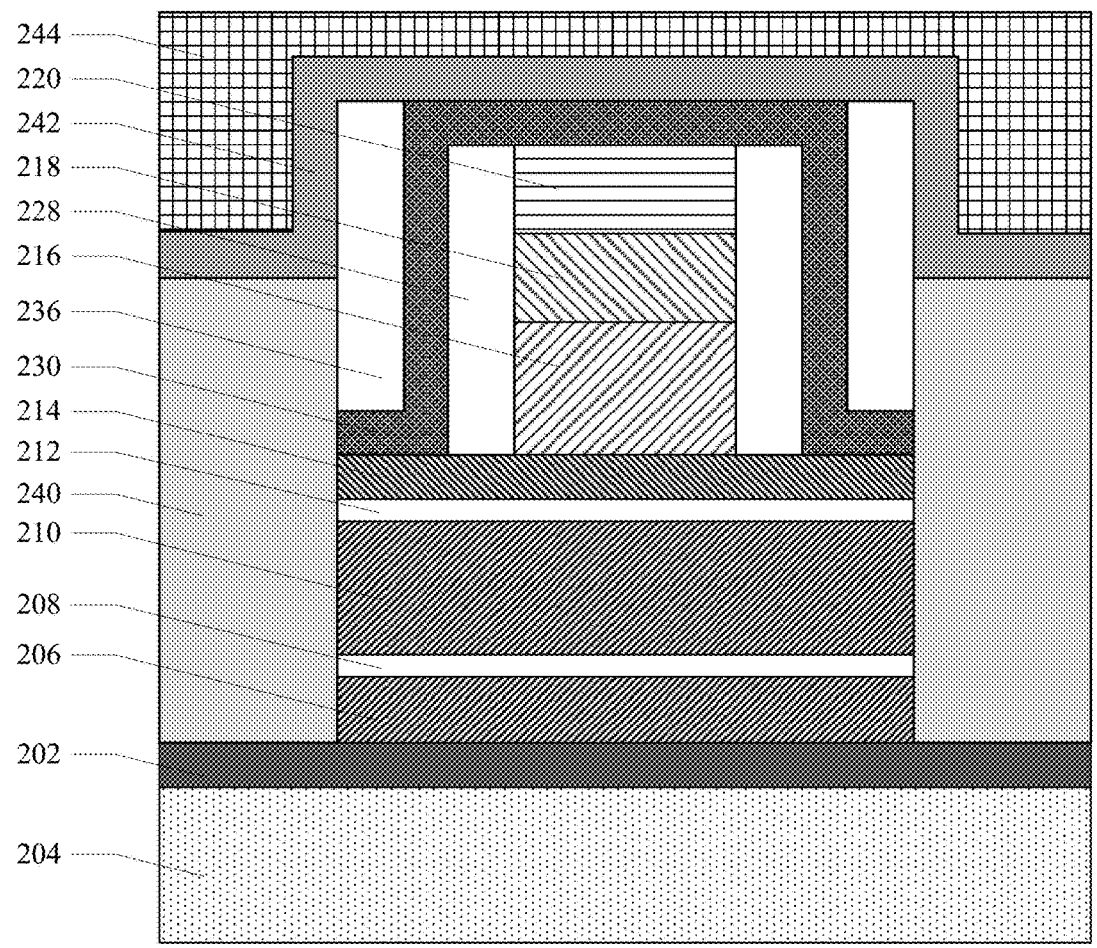

In one aspect, the conformal first insulating layer 224 can be selective etched 226 to form first sidewall insulators 228 self-aligned to the first portion of the MTJ pillars, at 126. Because a thickness of the conformal first insulating layer 224 is greater along a direction parallel to the sides of the first portion of the MTJ pillars, portions of the insulating layer will remain along the sidewalls of the first portion of the MTJ pillars by stopping the etching process after the insulating material is removed from the pillar mask 220 and the exposed portions of the free magnetic layer 214, as illustrated in FIG. 2D.

In one aspect, a first metal layer 230 can be formed, at 128. In one implementation, the first metal layer 230 can be Copper (Cu), Aluminum (Al), Ruthenium (Ru) or the like with a thickness of approximately 5-20 nm. The first metal layer 230 can be deposited by Physical Vapor Deposition (PVD) or Ion Beam Deposition (IBD) on the first portion of the MTJ pillars, the first sidewall insulators 228 and the exposed portions of the free magnetic layer 214. The first metal layer 230 can make electrical contact with the free magnetic layer or one or more top intermediate layers.

In one aspect, a conformal second insulating layer 232 can be formed on the first metal layer 230, at 130. In one implementation, the conformal second insulating layer 232 can be silicon dioxide (SiO$_2$), silicon nitride (SiN), or the like with a thickness of approximately 5-10 nm. The conformal first insulating layer 232 can be deposited by Atomic Layer Deposition (ALD) or Plasma Enhanced Chemical Vapor Deposition. In one aspect, the conformal second insulating layer 232 can be selective etched 234 to form second sidewall insulators 236 self-aligned to the first portion of the MTJ pillars, at 132.

In one aspect, the exposed first metal layer 230, the free magnetic layer 214, the tunneling barrier layer 212, the reference magnetic layer 210, the first non-magnetic layer 208, and the first ferromagnetic layer 206 can be selective etched 238 to form the MTJ pillars, at 134. The MTJ pillars can include pillar contacts coupled to the free magnetic layer. One or more etching processes appropriate for the different materials of the first metal layer 230, the free magnetic layer 214, the tunneling barrier layer 212, the reference magnetic layer 210, the first non-magnetic layer 208, and the first ferromagnetic layer 206 can be used.

Figure 2I:
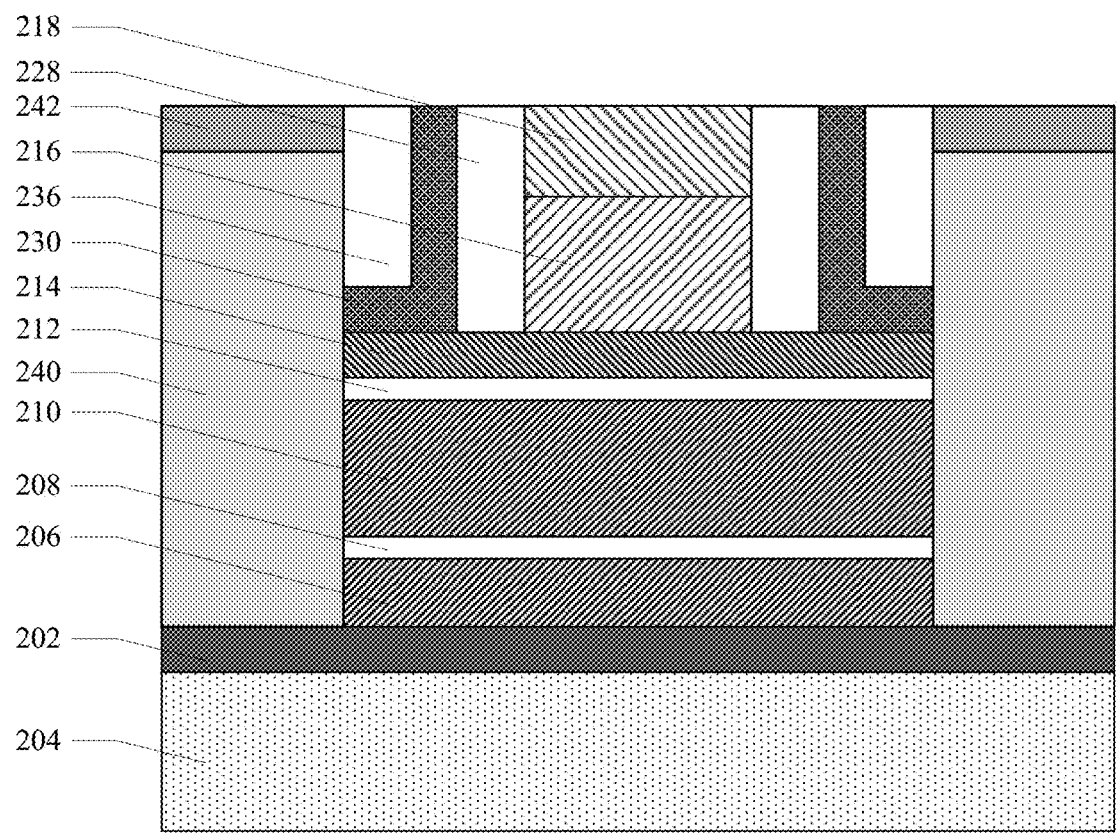
Figure 2J:
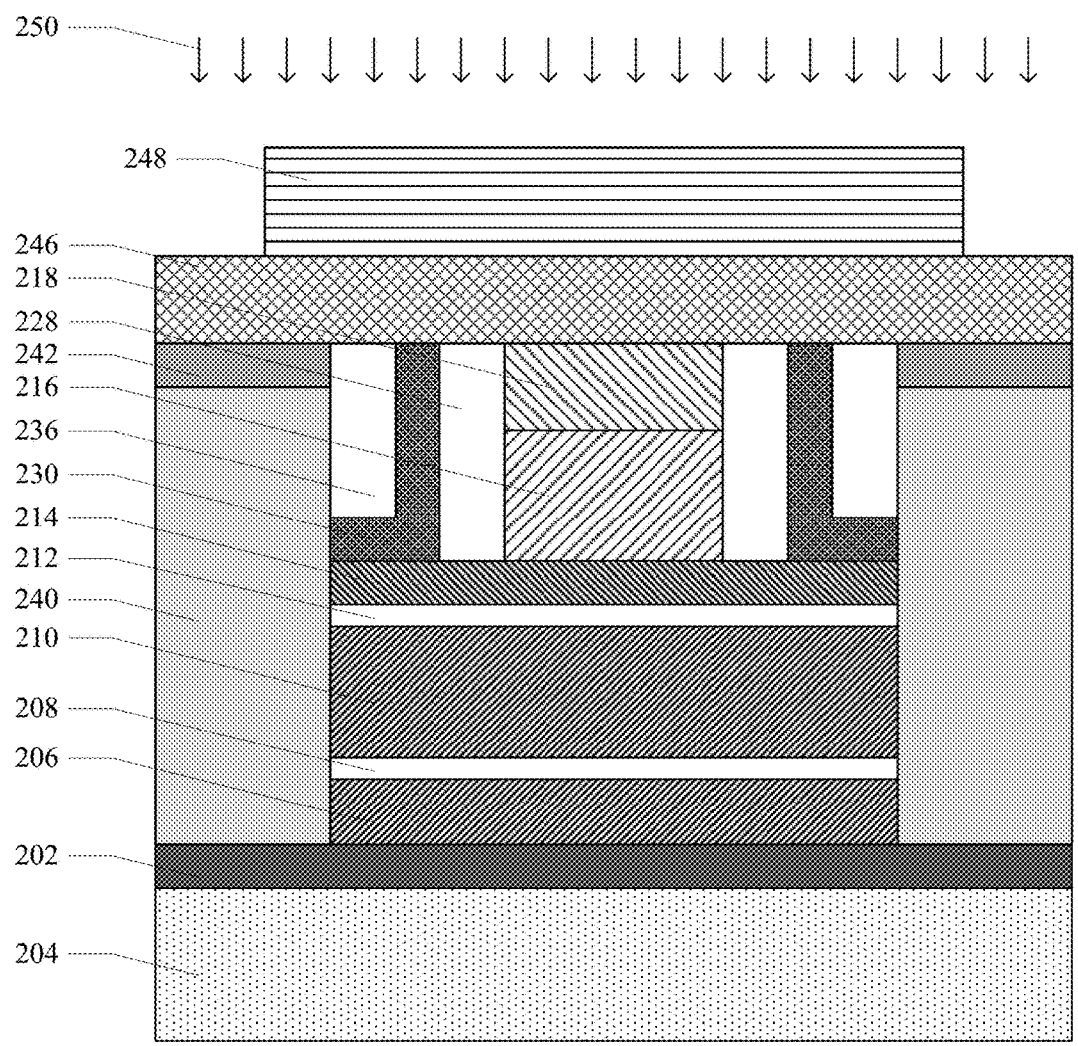
Figure 2K:
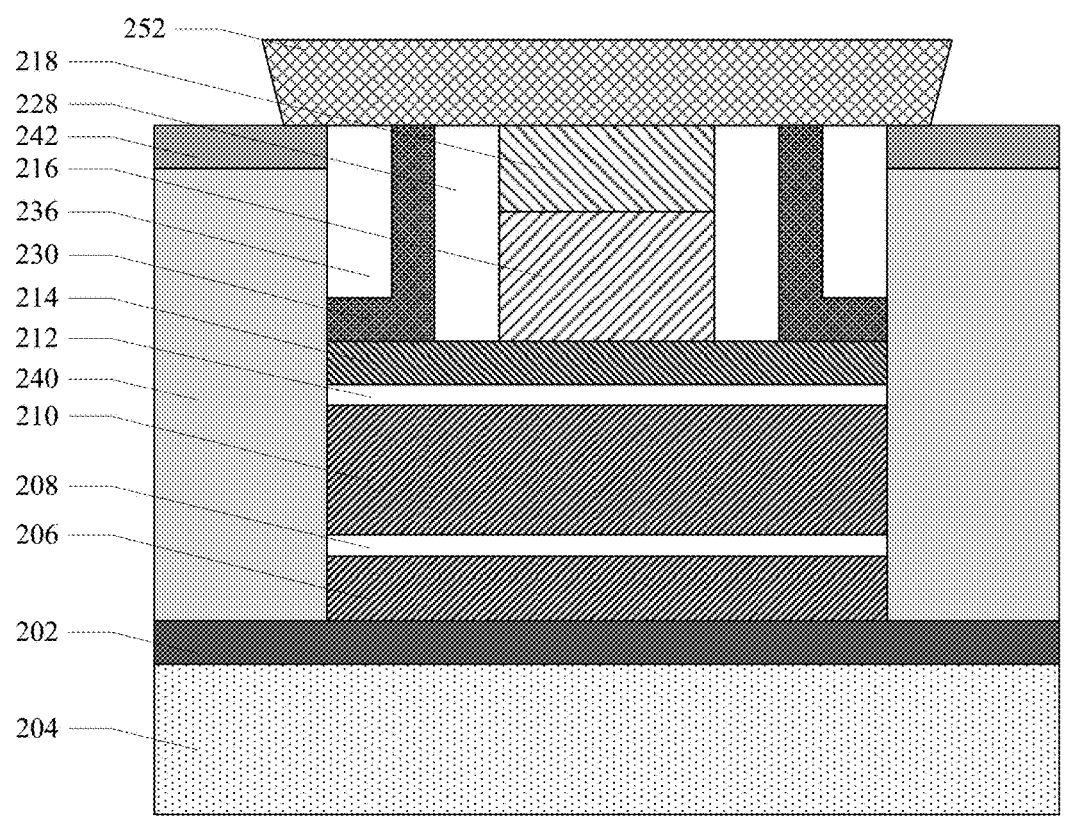
Figure 3A:
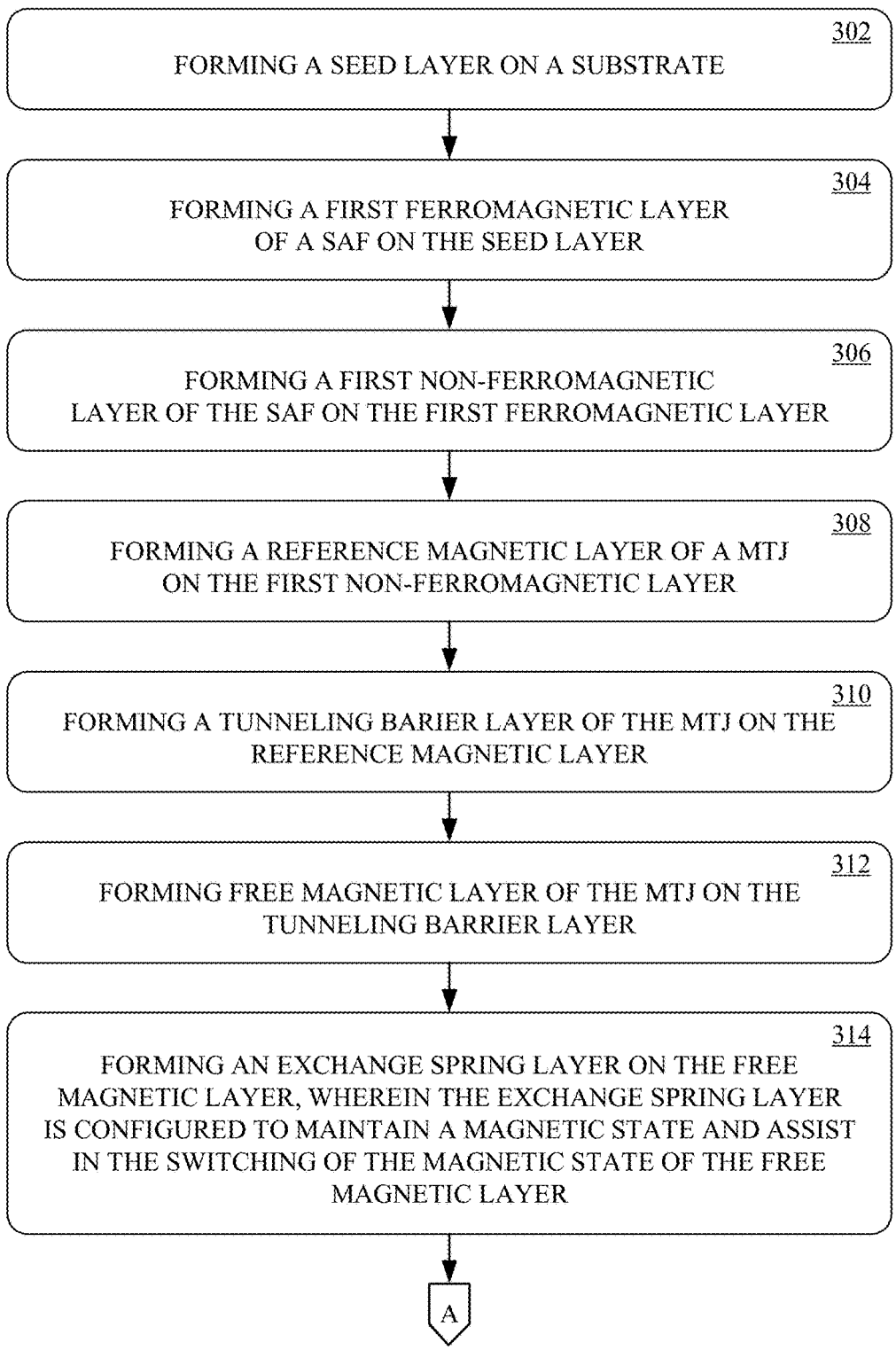
FIGS. 3A-3D show a flow diagram of a method of fabricating Magnetic Tunnel Junction (MTJ) device, in accordance with another embodiment of the present technology.
Figure 3B:
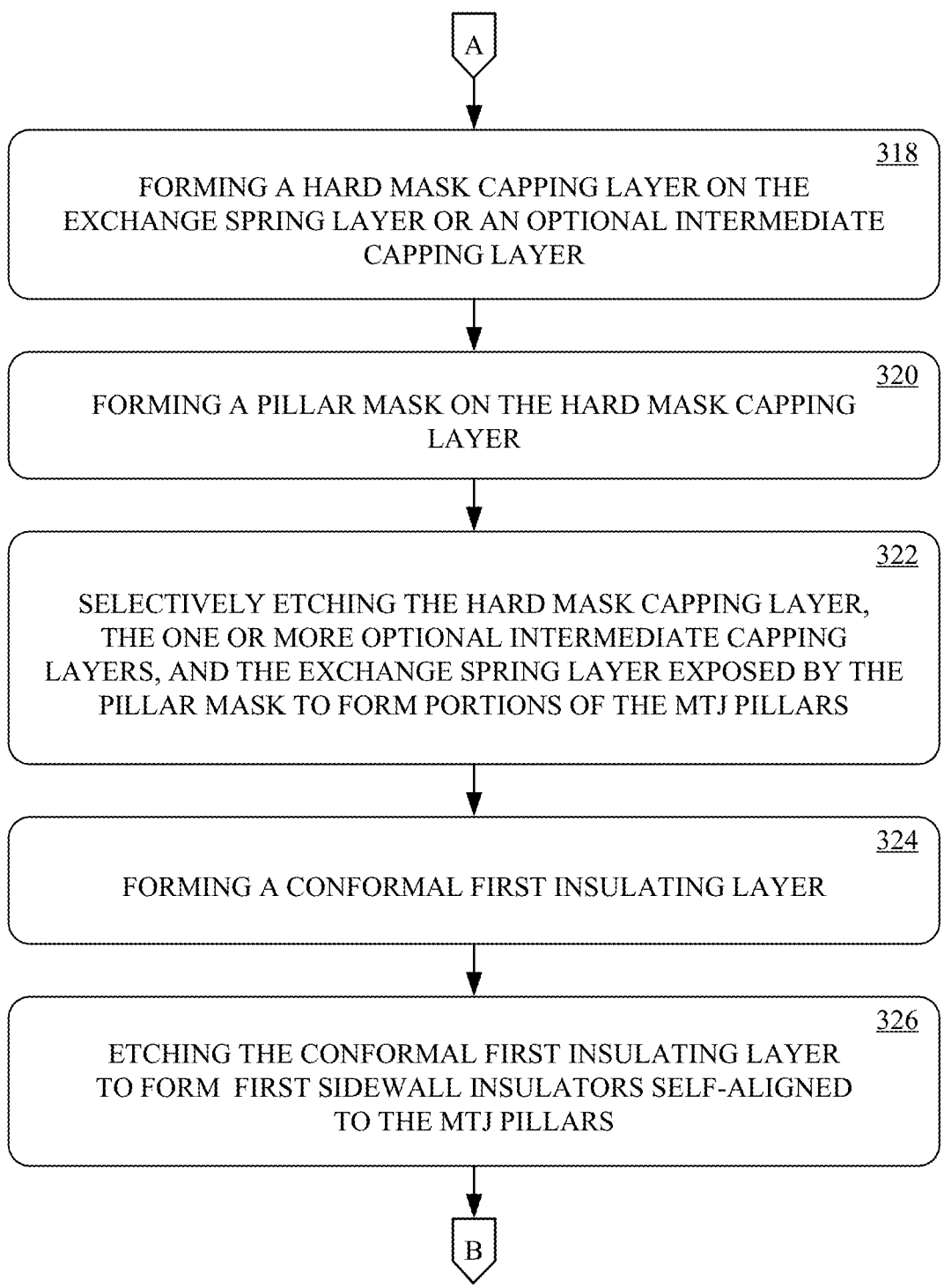
Figure 3C:
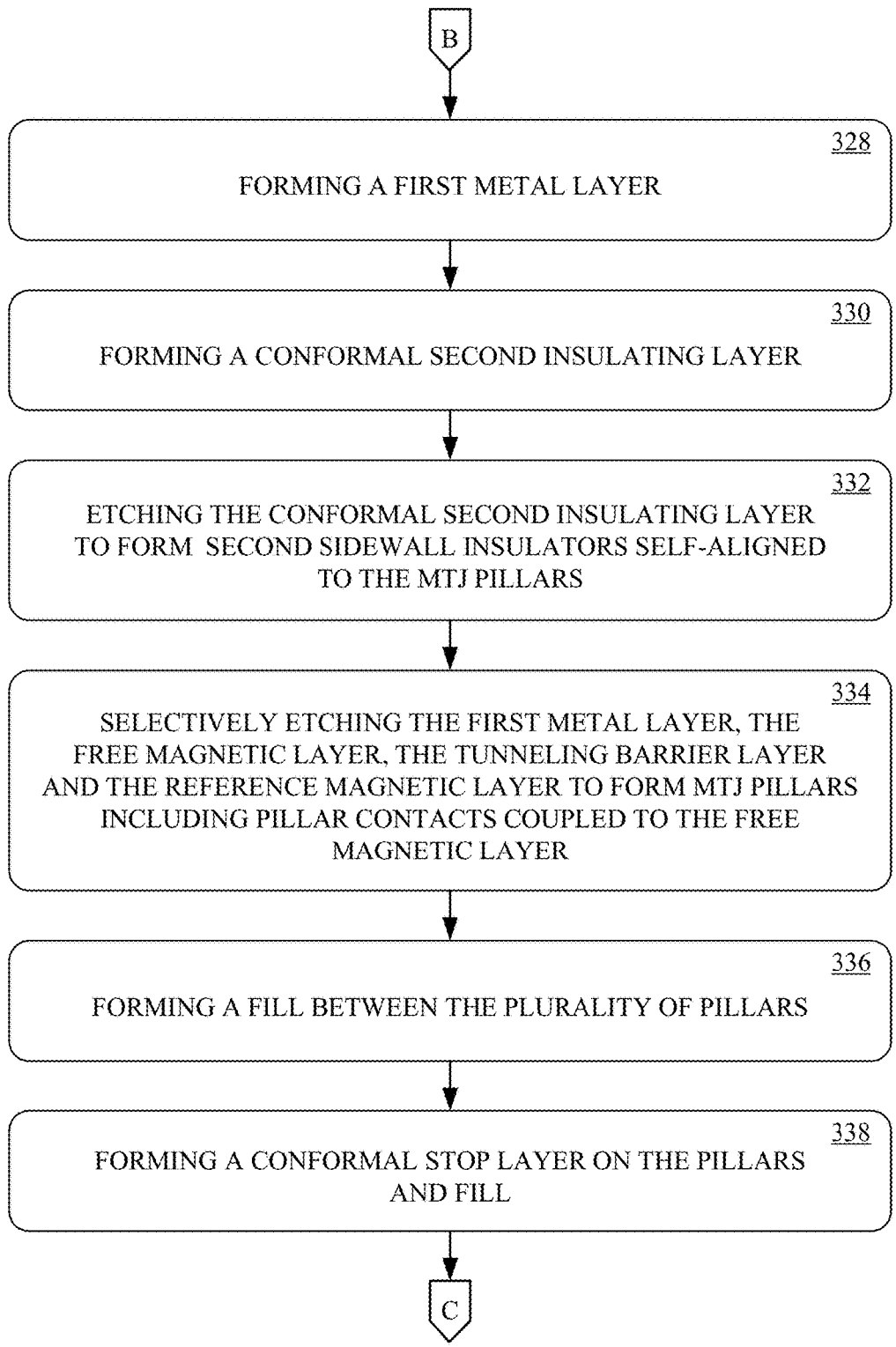
Figure 3D:
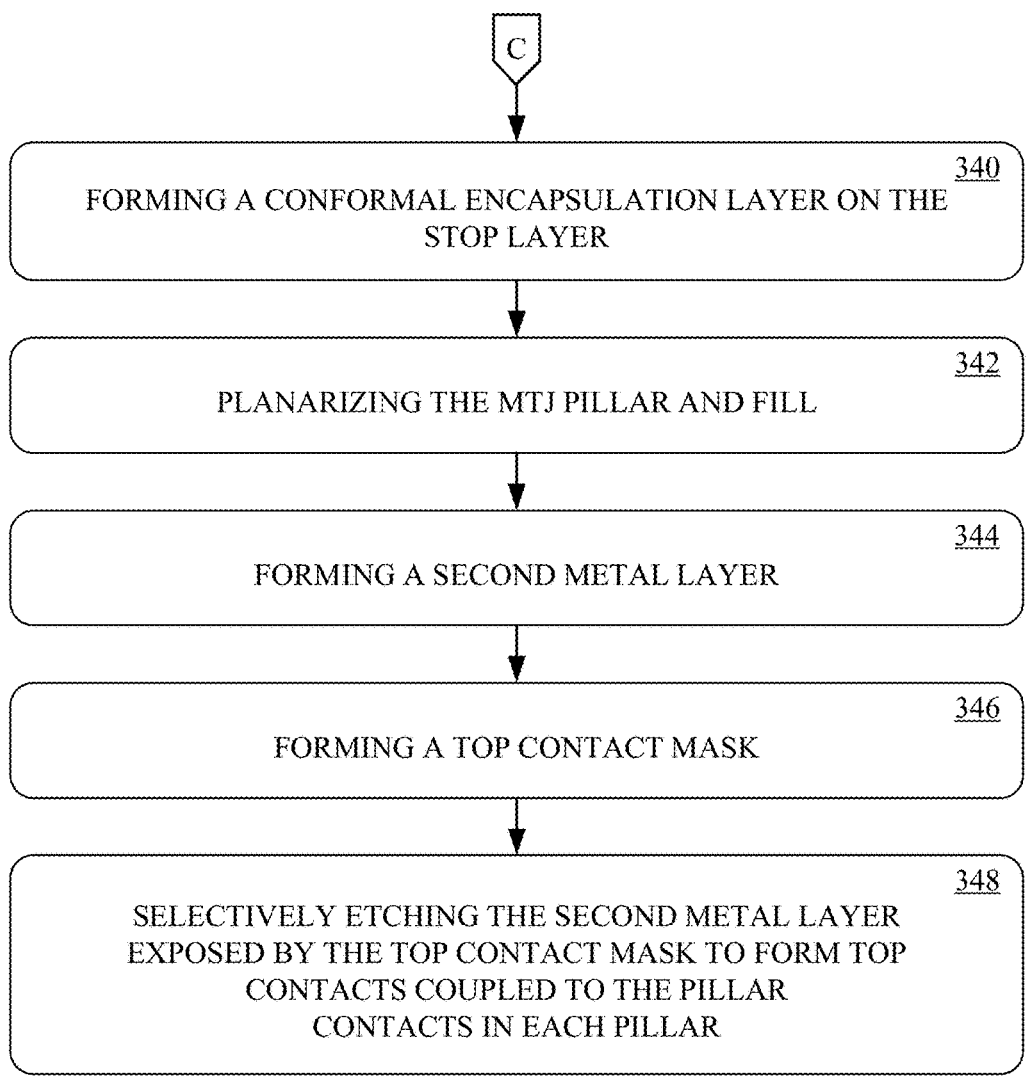

In one aspect, a fill 240 can be formed between the pillars, at 136. In one implementation, the fill 240 can be Silicon Oxide (SiOx) or Silicon Nitride (SiNx) deposited with a thickness of approximately 30-50 nm. In one aspect, a conformal stop layer 242 can be formed on the pillars and fill, at 138. In one implementation, the conformal stop layer 242 can be a Chemical-Mechanical Polishing (CMP) stop layer of Silicon Nitride (SiNx) with a thickness of approximately 5-10 nm. In one aspect, a conformal encapsulant 244 can be formed on the conformal stop layer 242, at 140. In one implementation, the conformal encapsulant 244 can be Silicon Oxide (SiOx) with a thickness of approximately 10-20 nm. In one aspect, the conformal encapsulant 244 can be removed, and the MTJ pillars and fill 240 can be planarized, at 142. In one implementation, a Chemical Mechanical Polishing (CMP) process can be performed to remove the conformal encapsulant 244, and to planarize the surface of the MTJ pillars and fill 240. The CMP process can be stopped when the conformal stop layer 242 on the fill 240 between the MTJ pillars is reached, as illustrated in FIG. 2I.

In one aspect, a second metal layer 246 can be formed, at 144. In one implementation, the second metal layer 246 can be Copper (Cu) or Aluminum (Al) with a thickness of approximately 25 nm. In one aspect, a top contact mask 248 can be formed on the second metal layer 246, at 146. In one implementation, the top contact mask 248 can be formed utilizing conventional photolithography masking processes. In one aspect, the second metal layer 246 exposed by the top contact mask 248 can be selectively etched 250 to form a top contact 252 coupled to the pillar contacts 230 in each pillar, at 148.

Referring to FIGS. 3A-3D, a flow diagram of a method of fabricating Magnetic Tunnel Junction (MTJ) device, in accordance with an embodiment of the present technology, is shown. The method will be further described with reference to FIGS. 4A-4K, which show a block diagram illustrating fabrication of the MTJ device. In one aspect, a seed layer 402 on a substrate 404, at 302. The seed layer 402 can be deposited on the substrate 402 to initiate a predetermined crystalline growth in one or more subsequent deposited layers. In one implementation, the seed layer 402 can include one or more layers of Tantalum (Ta) with a thickness of approximately 5 nanometers (nm).

In one aspect, a first ferromagnetic layer 406 can be formed on the seed layer 404, at 304. In one implementation, the first ferromagnetic layer 406 can include one or more layers of a Cobalt-Iron (Co—Fe), Cobalt Nickel (CoNi), or Cobalt Platinum (CoPt) alloy with a thickness of approximately 5-15 nm. At 306, a first non-magnetic layer 408 can be formed on the first ferromagnetic layer 406. In one implementation, the first non-magnetic layer 408 can include one or more layers of a Ruthenium (Ru) alloy with a thickness of approximately 30-100 nm. The first ferromagnetic layer 406, the first non-magnetic layer 408, and a subsequently described reference magnetic layer 410 can form a Synthetic Antiferromagnetic (SAF) 406-410 of the MTJ device.

In one aspect, a reference magnetic layer 410 can be formed on the first non-magnetic layer 408, at 308. In one implementation, the reference magnetic layer 410 can include one or more layers of a Cobalt-Iron-Boron (Co—Fe—B) alloy with a thickness of approximately 1-5 nm. At 310, a tunneling barrier layer 412 can be formed on the reference magnetic layer 410. In one implementation, the tunneling barrier layer 412 can include one or more layers of a Ruthenium (Ru) alloy with a thickness of approximately 0.1-1 nm. At 312, a free magnetic layer 414 can be formed on the non-magnetic tunneling barrier layer 412. In one implementation, the free magnetic layer 414 can include one or more layers of a Cobalt-Iron-Boron (Co—Fe—B) alloy with a thickness of approximately 0.5-2 nm.

In one aspect, the reference magnetic layer 410 can have its magnetization pinned in a predetermined direction, meaning that the reference magnetic layer 410 has a higher coercivity than other layers and a larger magnetic field or spin-polarized current is needed to change the orientation of its magnetization. The magnetization direction of the free magnetic layer 414 can be changed by a smaller magnetic field or sin-polarized current relative to the reference magnetic layer 410. In one implementation, the magnetization vector of the first ferromagnetic layer 406 and the reference magnetic layer 410 can be substantially perpendicular (e.g., within several degrees) to a plane of the layers (e.g., along a z-axis). The magnetization vector of the free magnetic layer 414 can also be substantially perpendicular to the plane of the layer (e.g., along a z-axis), but its direction can vary by 180 degrees.

In one aspect, an exchange spring layer 416 can be formed on the free magnetic layer 414, at 314. The exchange spring layer 416 can be configured to maintain a magnetic polarization state of the free magnetic layer 414. In one implementation, the exchange spring layer 416 can be Iron Platinum (FePt) or Cobalt Chromium Platinum (CoCrPt) with a thickness of approximately 1-5 nm. In one implementation, the exchange spring layer 416 can be magnetically softer than the reference magnetic layer 410, but magnetically harder than the free magnetic layer 414. In one aspect, a hard mask capping layer 418 can be formed on the exchange spring layer 416, at 318. In one implementation, the hard mask capping layer can be a Silicon Oxide (SiOx), a Silicon Nitride (SiNx) or Aluminum Oxide (AlOx) with a thickness of approximately 5-20 nm.

Figure 4A:
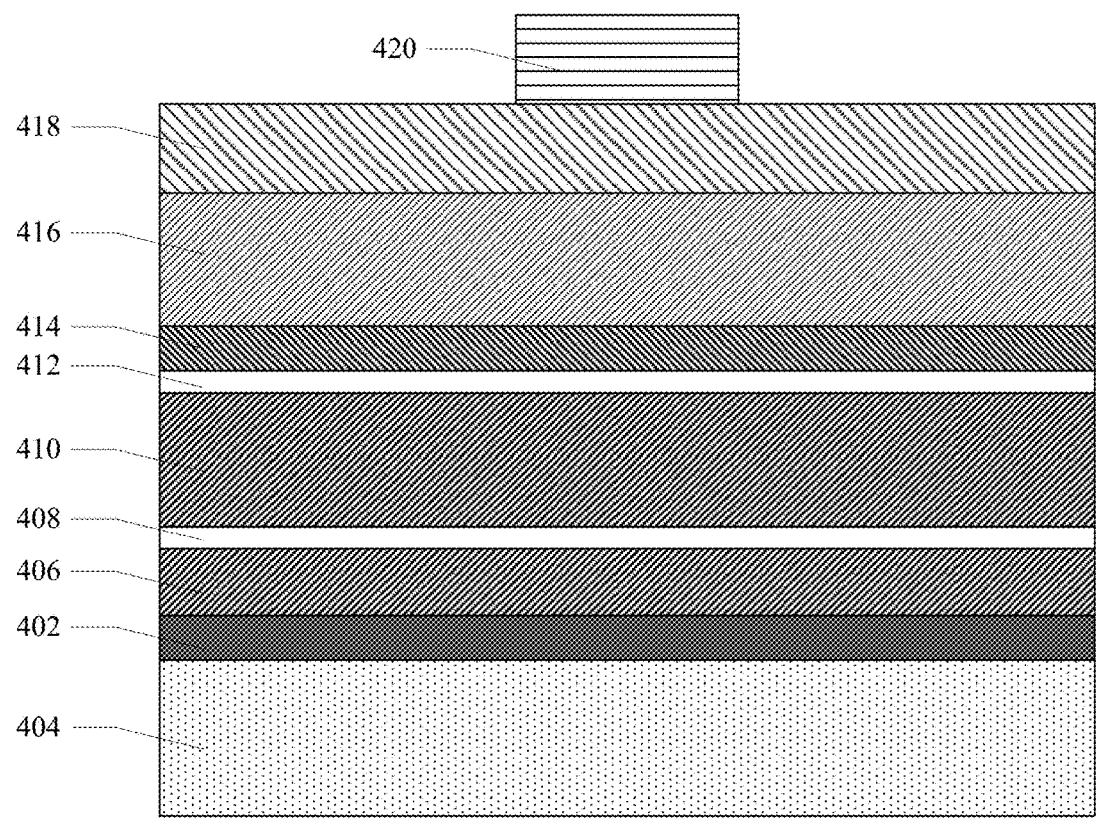
FIGS. 4A-4K show a block diagram illustrating fabrication of a MTJ device, in accordance with another embodiment of the present technology.
Figure 4B:
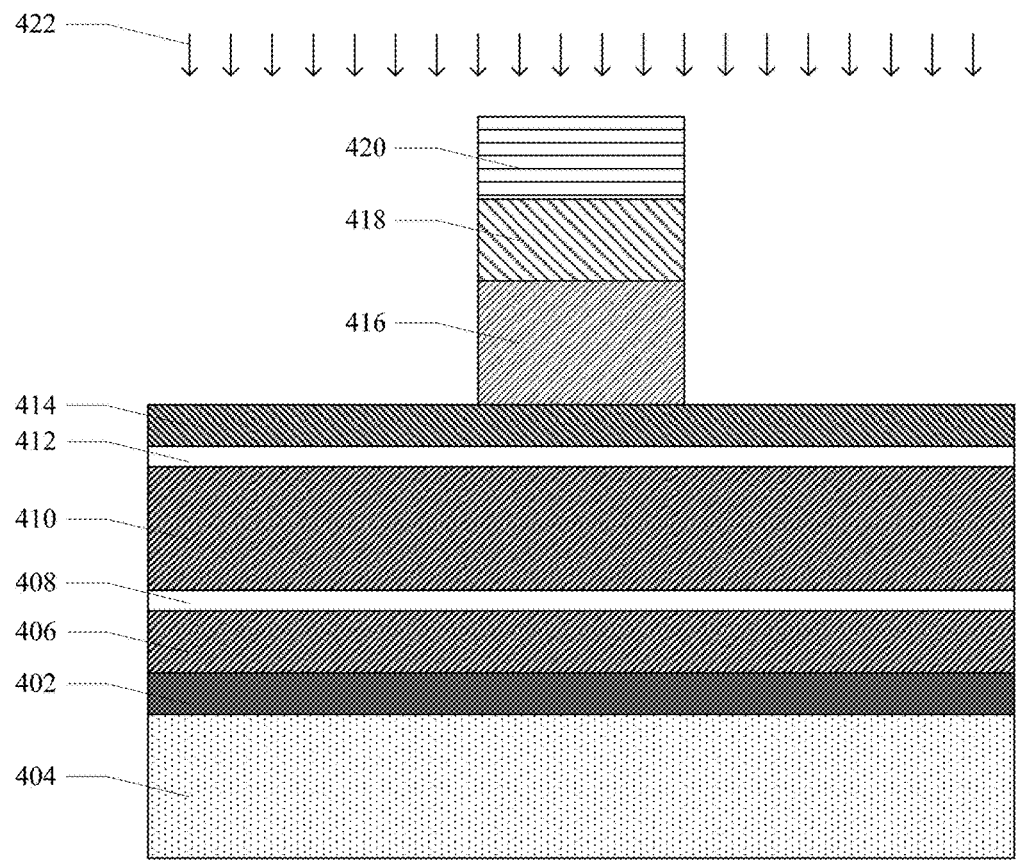
Figure 4C:
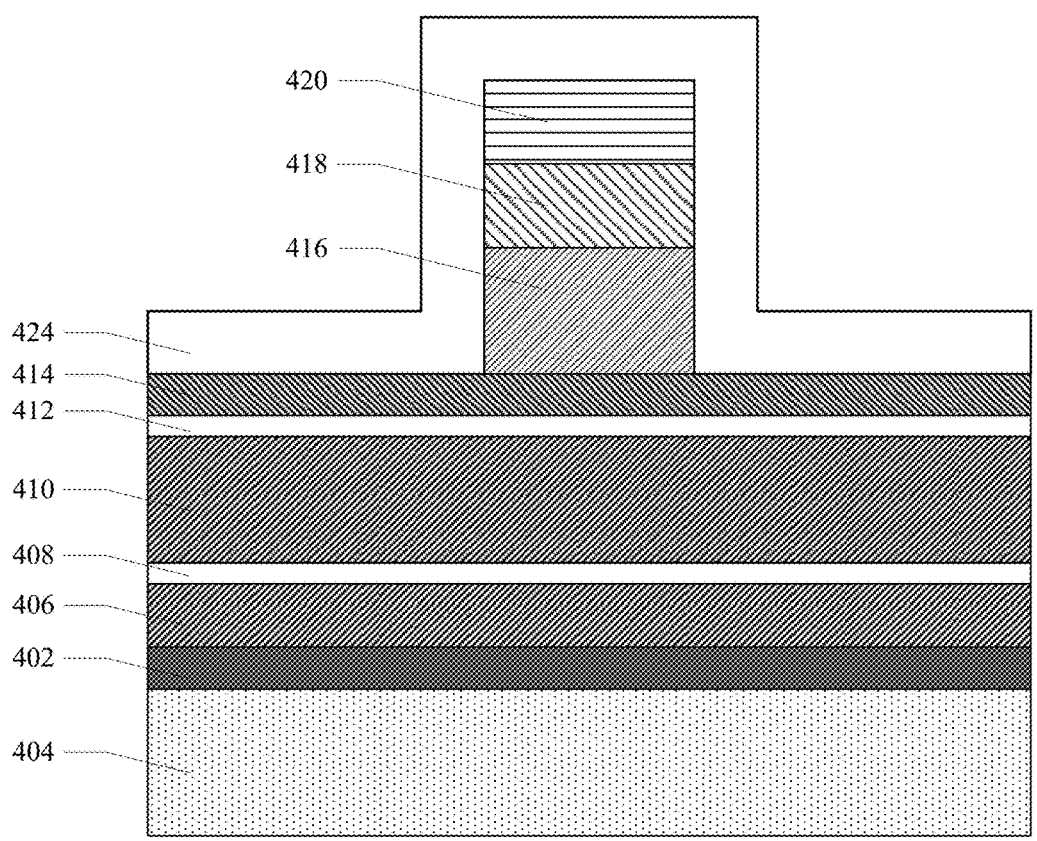

In one aspect, a pillar mask 420 can be formed on the hard mask capping layer 418, at 320. In one implementation, the pillar mask 420 can be formed utilizing conventional photolithography masking processes. In one aspect, the hard mask capping layer 418, the one or more optional intermediate capping layers if included, and the exchange spring layer 416 exposed by the pillar mask 420 can be selective etched 422 to form a first portion of MTJ pillars, at 322. The selective etching 422 can be performed until the free magnetic layer 414 between the first portion of the MTJ pillars is exposed, as illustrated in FIG. 4B. One or more etching processes appropriate for the different materials of the hard mask capping layer 418, the one or more optional intermediate capping layers if included, and the exchange spring layer 416 can be used. In one implementation, the hard mask capping layer 418, and the one or more optional intermediate capping layers if included, can be ion beam etched. The exchange spring layer 416 can be reactive ion etched.

In one aspect, a conformal first insulating layer 424 can be formed, at 324. In one implementation, the conformal first insulating layer 424 can be silicon dioxide (SiO$_2$), silicon nitride (SiN), or the like with a thickness of approximately 5-10 nm. The conformal first insulating layer 424 can be deposited by Atomic Layer Deposition (ALD) or Plasma Enhanced Chemical Vapor Deposition on the first portion of the MTJ pillars and the exposed portions of the free magnetic layer 414.

Figure 4D:
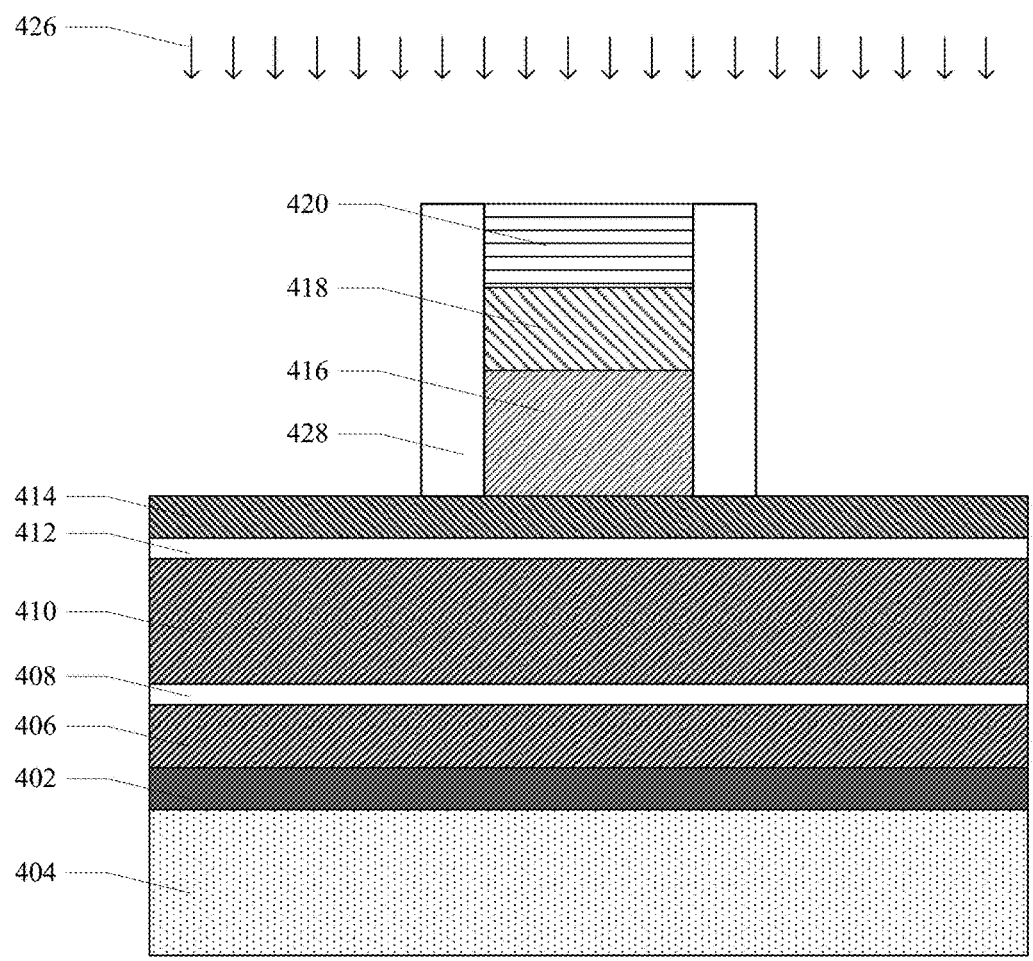
Figure 4E:
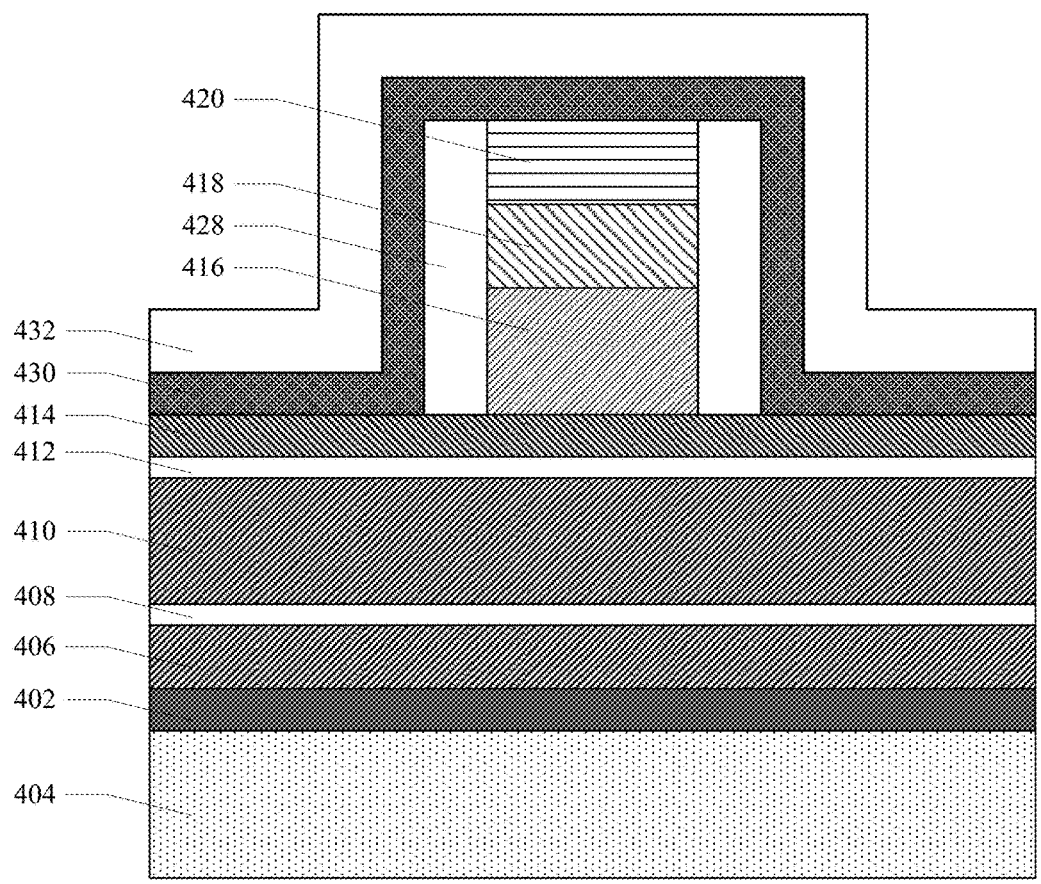
Figure 4F:
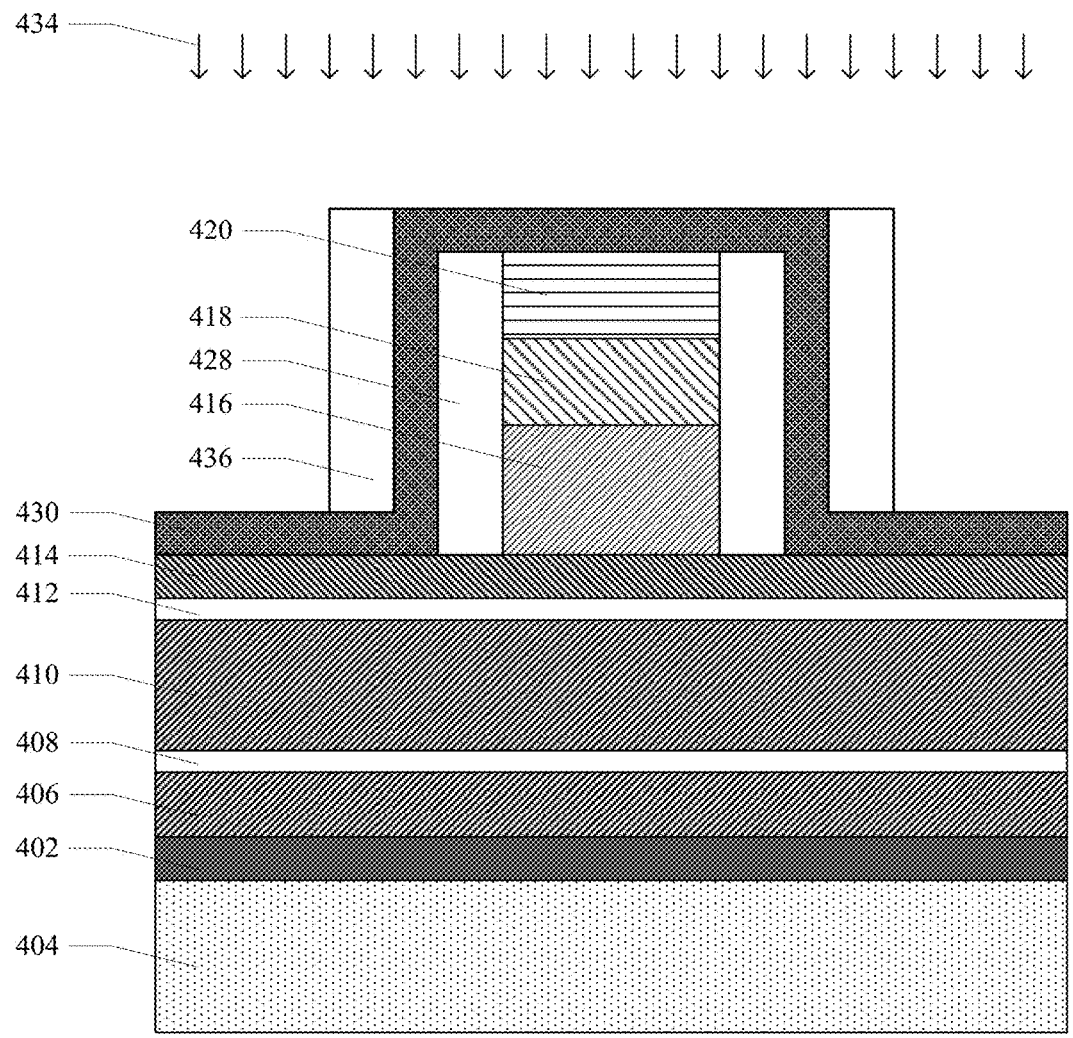
Figure 4G:
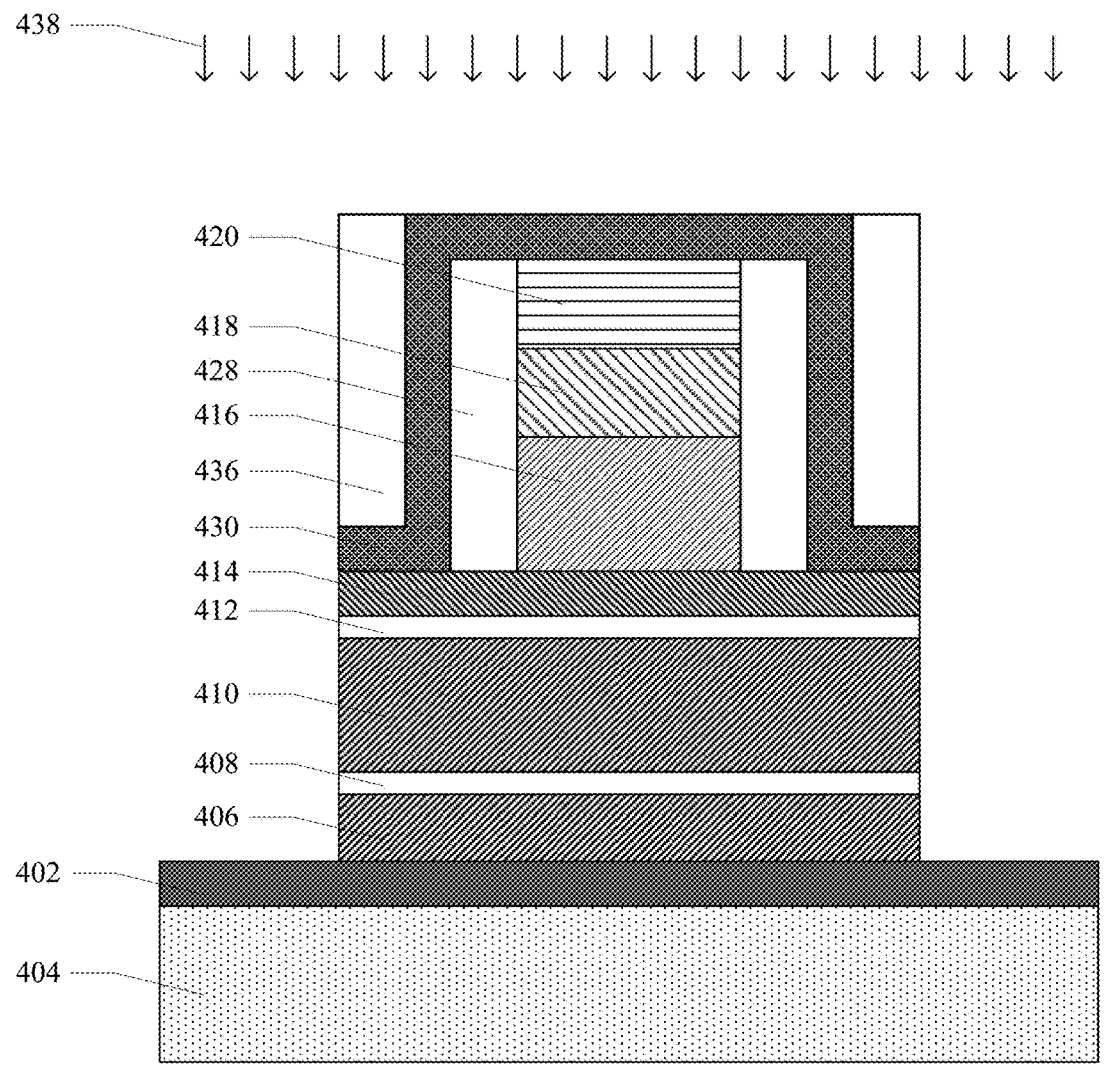
Figure 4H:
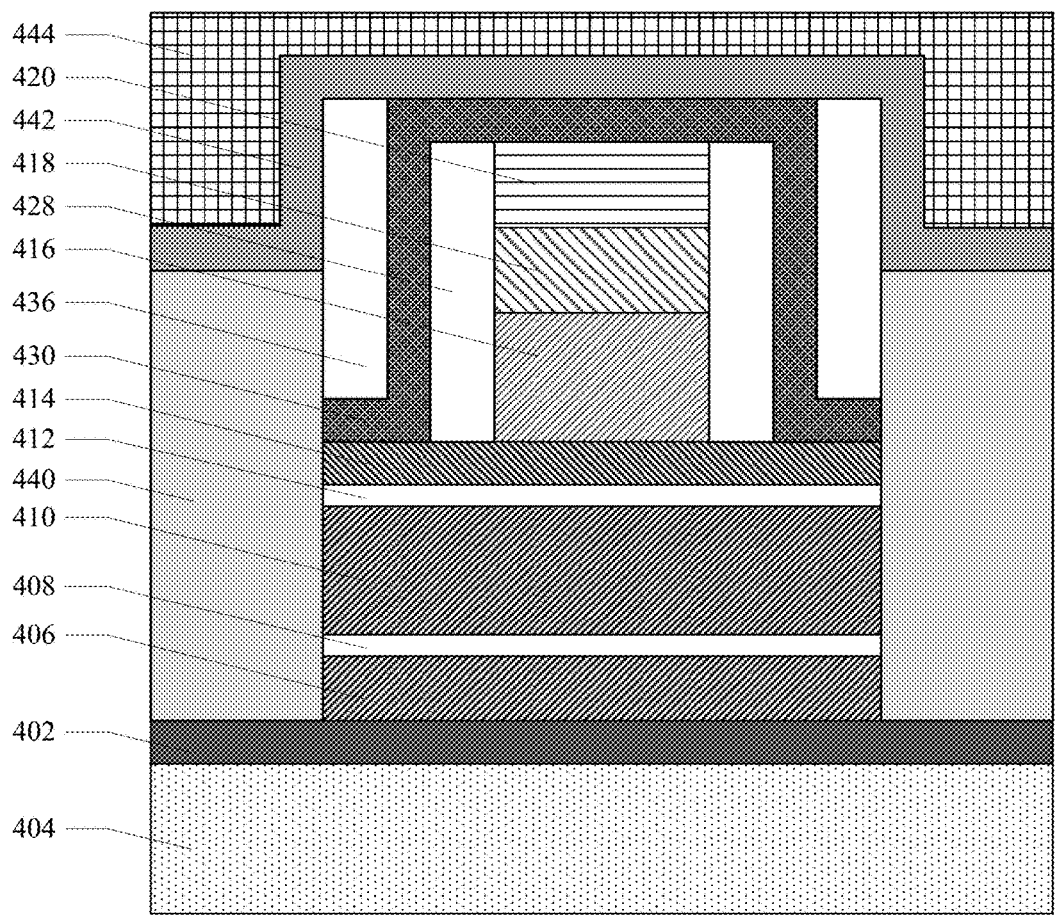

In one aspect, the conformal first insulating layer 424 can be selective etched 426 to form first sidewall insulators 428 self-aligned to the first portion of the MTJ pillars, at 326. Because a thickness of the conformal first insulating layer 424 is greater along a direction parallel to the sides of the first portion of the MTJ pillars, portions of the insulating layer will remain along the sidewalls of the first portion of the MTJ pillars by stopping the etching process after the insulating material is removed from the pillar mask 420 and the exposed portions of the free magnetic layer 414, as illustrated in FIG. 4D.

In one aspect, a first metal layer 430 can be formed, at 328. In one implementation, the first metal layer 430 can be Copper (Cu), Aluminum (Al), Ruthenium (Ru) with a thickness of approximately 5-20 nm. The first metal layer 430 can be deposited by Physical Vapor Deposition (PVD) or Ion Beam Deposition (IBD) on the first portion of the MTJ pillars, the first sidewall insulators 428 and the exposed portions of the free magnetic layer 414.

In one aspect, a conformal second insulating layer 432 can be formed on the first metal layer 430, at 330. In one implementation, the conformal second insulating layer 432 can be silicon dioxide (SiO$_2$), silicon nitride (SiN), or the like with a thickness of approximately 5-10 nm. The conformal first insulating layer 432 can be deposited by Atomic Layer Deposition (ALD) or Plasma Enhanced Chemical Vapor Deposition. In one aspect, the conformal second insulating layer 432 can be selective etched 434 to form second sidewall insulators 436 self-aligned to the first portion of the MTJ pillars, at 332.

In one aspect, the exposed first metal layer 430, the free magnetic layer 414, the tunneling barrier layer 412, the reference magnetic layer 410, the first non-magnetic layer 408, and the first ferromagnetic layer 406 can be selective etched 438 to form the MTJ pillars, at 334. The MTJ pillars can include pillar contacts coupled to the free magnetic layer. One or more etching processes appropriate for the different materials of the first metal layer 430, the free magnetic layer 414, the tunneling barrier layer 412, the reference magnetic layer 410, the first non-magnetic layer 408, and the first ferromagnetic layer 406 can be used.

Figure 4I:
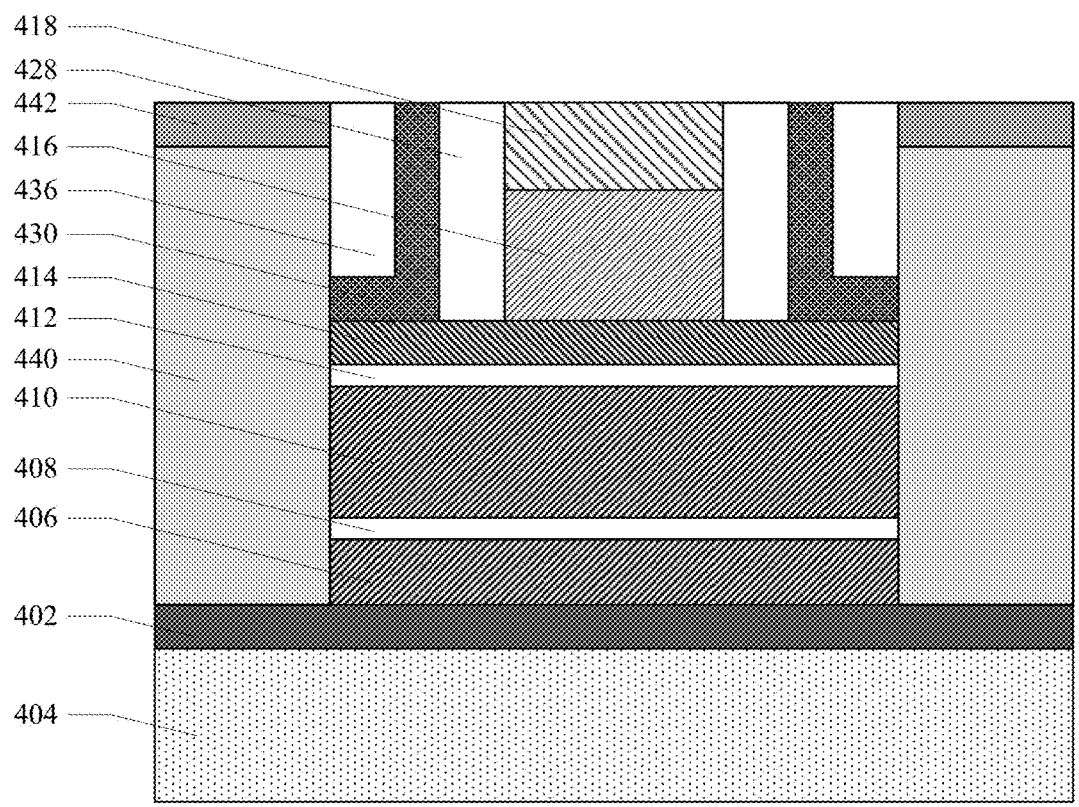
Figure 4J:
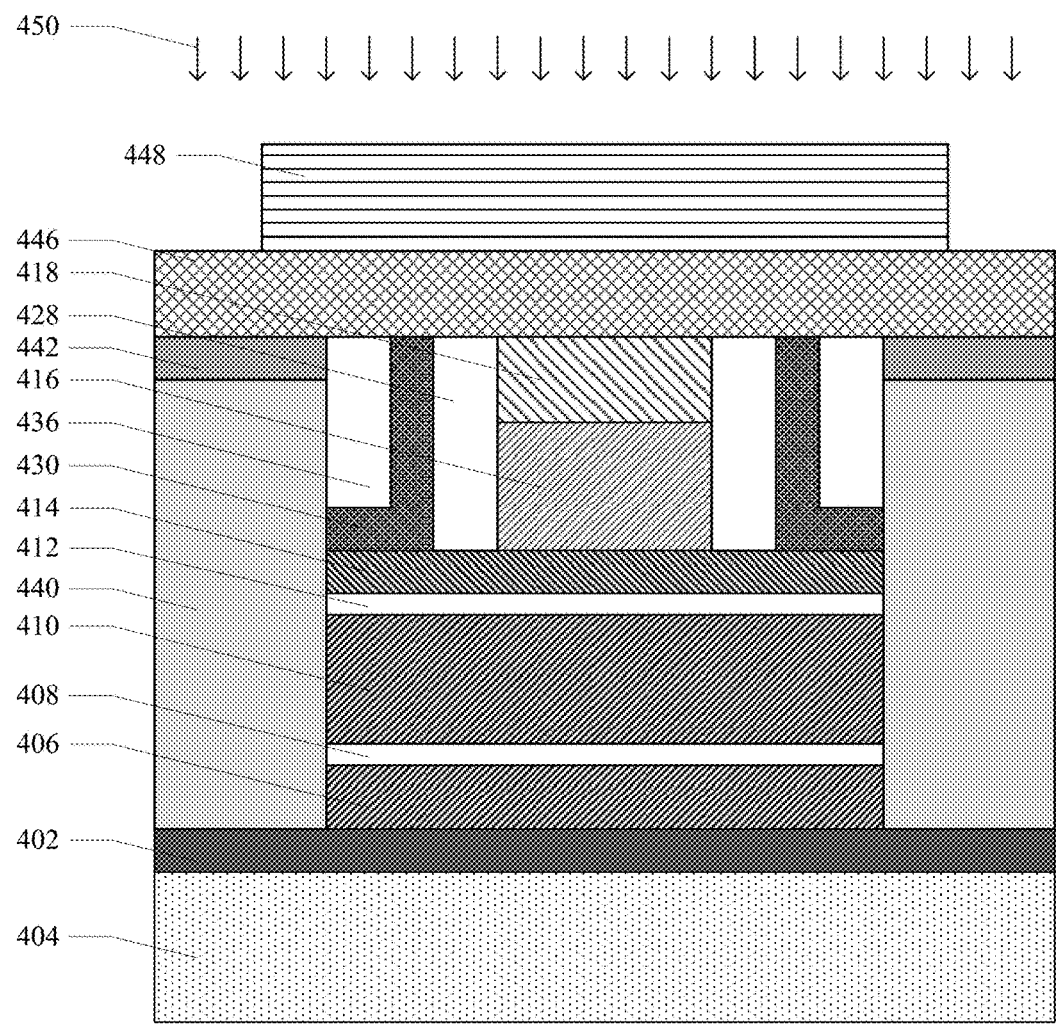
Figure 4K:
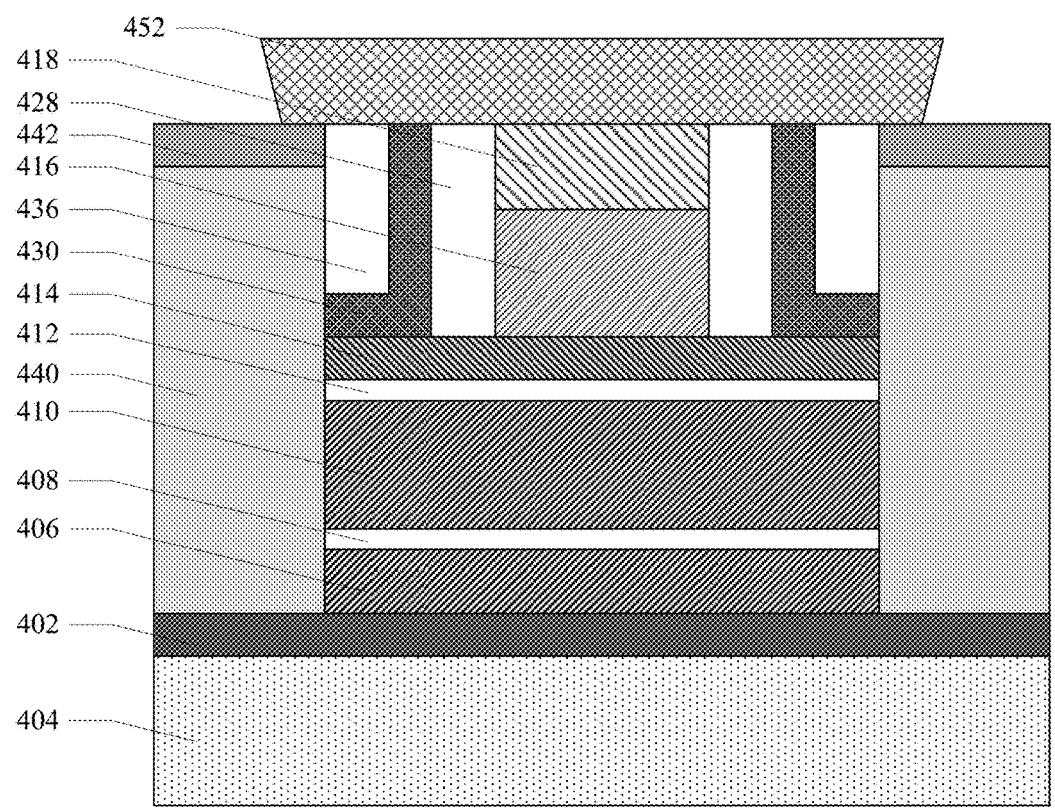

In one aspect, a fill 440 can be formed between the pillars, at 336. In one implementation, the fill 440 can be Silicon Oxide (SiOx) or Silicon Nitride (SiNx) deposited by 30-50 deposition. In one aspect, a conformal stop layer 442 can be formed on the pillars and fill, at 338. In one implementation, the conformal stop layer 442 can be Silicon Nitride (SiNx) with a thickness of approximately 5-10 nm. In one aspect, a conformal encapsulant 444 can be formed on the conformal stop layer 442, at 340. In one implementation, the conformal encapsulant 444 can be Silicon Oxide (SiOx) with a thickness of approximately 10-20 nm. In one aspect, the conformal encapsulant 444 can be removed, and the MTJ pillars and fill 440 can be planarized, at 342. In one implementation, a Chemical Mechanical Polishing (CMP) process can be performed to remove the conformal encapsulant 444, and to planarize the surface of the MTJ pillars and fill 440. The CMP process can be stopped when the conformal stop layer 442 on the fill 440 between the MTJ pillars is reached, as illustrated in FIG. 4I.

In one aspect, a second metal layer 446 can be formed, at 344. In one implementation, the second metal layer can be Copper (Cu) or Aluminum (Al) with a thickness of approximately 25 nm. In one aspect, a top contact mask 448 can be formed on the second metal layer 446, at 346. In one implementation, the top contact mask 448 can be formed utilizing conventional photolithography masking processes. In one aspect, the second metal layer 446 exposed by the top contact mask 448 can be selectively etched 450 to form a top contact 452 coupled to the pillar contacts 430 in each pillar, at 348.

Embodiments of the present technology advantageously provide additional magnetic factors to assist the optimization of MTJ device without impacting the overall electrical resistance of the device. The self-aligned sidewall insulators advantageously electrically isolate a top region of the MTJ sidewalls, while pillar contacts advantageously provide electrical coupling between the free magnetic layer of the MTJ and a top contact.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A method of manufacturing a Magnetic Tunnel Junction (MTJ) device comprising:
   forming portions of MTJ pillars including a free magnetic layer;
   forming a conformal first insulating layer on the portion of MTJ pillars;
   etching the conformal first insulating layer to form first sidewall insulators self-aligned to the MTJ pillars;
   forming a first metal layer;
   forming a conformal second insulating layer;
   etching the conformal second insulating layer to form second sidewall insulators self-aligned to the MTJ pillars; and
   selectively etching the first metal layer and the free magnetic layer to further form the MTJ pillars including pillar contacts coupled to the free magnetic layer.

2. The method according to claim 1, further comprising:
   forming the static magnetic compensation layer on the free magnetic layer, wherein the static magnetic compensation layer is configured to compensate for one or more parasitic magnetic characteristics proximate the free magnetic layer.

3. The method according to claim 2, wherein forming portions of the plurality of MTJ pillars including a free magnetic layer comprises:
   forming a hard mask capping layer on the static magnetic compensation layer;
   forming a pillar mask on the hard mask capping layer; and
   selectively etching the hard mask capping layer and the static magnetic compensation layer exposed by the pillar mask to form the portion of the MTJ pillars.

4. The method according to claim 3, further comprising:
   forming a reference magnetic layer;
   forming a tunneling barrier layer on the reference magnetic layer;
   forming the free magnetic layer on the tunneling barrier layer; and
   wherein selectively etching the first metal layer and the free magnetic layer to form MTJ pillars further includes selectively etching the tunneling barrier layer and the reference magnetic layer.

5. The method according to claim 4, further comprising:
   forming a first ferromagnetic layer of a Synthetic Antiferromagnetic (SAF);
   forming a first non-magnetic layer of the SAF on the first ferromagnetic layer;
   forming the reference magnetic layer on the first non-magnetic layer; and
   wherein selectively etching the first metal layer and the free magnetic layer to form MTJ pillars further includes selectively etching the first non-magnetic layer and the first ferromagnetic layer of the SAF.

6. The method according to claim 5, further comprising:
   forming a seed layer on a substrate; and
   forming the first ferromagnetic layer of the SAF on the seed layer.

7. The method according to claim 3, further comprising:
   forming one or more intermediate capping layers between the static magnetic compensation layer and the hard mask layer.

8. The method according to claim 2, further comprising:
   forming one or more intermediate capping layers between the free magnetic layer and the static magnetic compensation layer.

9. The method according to claim 8, wherein the one or more intermediate capping layers include one or more of a Processional Spin Current (PSC) coupling layer, a Perpendicular Magnetic Anisotropy (PMA) enhancement layer, and a PSC magnetic layers.

10. The method according to claim 1, further comprising:
    forming a fill between the MTJ pillars;
    forming a conformal stop layer on the MTJ pillars and the fill;
    forming a conformal encapsulation layer on the stop layer;
    removing the encapsulation layer and planarizing the MTJ pillars and the fill down to the conformal stop layer;
    forming a second metal layer on the planarized MTJ pillars and the conformal stop layer;
    forming a top contact mask on the second metal layer; and
    selectively etching the second metal layer exposed by the top contact mask to form top contacts coupled to the pillar contacts in the MTJ pillars.

11. The method according to claim 10, wherein removing the encapsulation layer and planarizing the MTJ pillars and the fill down to the conformal stop layer include Chemical Mechanical Polishing (CMP) the encapsulation layer, the MTJ pillars and fill until the conformal stop on the fill is reached.

12. The method according to claim 1, wherein the static magnetic compensation layer includes a layer of Cobalt Platinum (CoPt) or Cobalt Iron (CoFe) with a thickness of approximately 0.5-5 nm.

13. A method of manufacturing a Magnetic Tunnel Junction (MTJ) device comprising:
forming portions of MTJ pillars including a free magnetic layer and an exchange spring layer;
forming a conformal first insulating layer;
etching the conformal first insulating layer to form first sidewall insulators self-aligned to the MTJ pillars;
forming a first metal layer;
forming a conformal second insulating layers;
etching the conformal second insulating layer to form second sidewall insulators self-aligned to the MTJ pillars; and
selectively etching the first metal layer and the free magnetic layer to further form the MTJ pillars including pillar contacts coupled to the free magnetic layer.

14. The method according to claim 13, further comprising:
forming the exchange spring layer on the free magnetic layer, wherein the exchange spring layer is configured to maintain a magnetic state of the free magnetic layer and assist in a switching of the magnetic state of the free magnetic layer.

15. The method according to claim 14, wherein forming the portions of the MTJ pillars including the free magnetic layer and the exchange spring layer comprises:
forming a hard mask capping layer on the exchange spring layer;
forming a pillar mask on the hard mask capping layer; and
selective etching the hard mask capping layer and the exchange spring layer exposed by the pillar mask to form the portions of the MTJ pillars.

16. The method according to claim 15, further comprising:
forming a reference magnetic layer;
forming a tunneling barrier layer on the reference magnetic layer;
forming the free magnetic layer on the tunneling barrier layer; and
wherein selectively etching the first metal layer and the free magnetic layer to form MTJ pillars further includes selectively etching the tunneling barrier layer and the reference magnetic layer.

17. The method according to claim 16, further comprising:
forming a first ferromagnetic layer of a Synthetic Antiferromagnetic (SAF);
forming a first non-magnetic layer of the SAF on the first ferromagnetic layer;
forming the reference magnetic layer on the first non-magnetic layer; and
wherein selectively etching the first metal layer and the free magnetic layer to form MTJ pillars further includes selectively etching the first non-magnetic layer and the first ferromagnetic layer of the SAF.

18. The method according to claim 17, further comprising:
forming a seed layer on a substrate; and
forming the first ferromagnetic layer of the SAF on the seed layer.

19. The method according to claim 16, wherein the exchange spring layer is magnetically softer than the reference magnetic layer and magnetically harder than the free magnetic layer.

20. The method according to claim 15, further comprising:
forming one or more intermediate capping layers between the exchange spring layer and the hard mask layer.

21. The method according to claim 15, further comprising:
forming one or more intermediate capping layers between the free magnetic layer and the exchange spring layer.

22. The method according to claim 21, wherein the one or more intermediate capping layers include one or more of a Processional Spin Current (PSC) coupling layer, a Perpendicular Magnetic Anisotropy (PMA) enhancement layer, and a PSC magnetic layers.

23. The method according to claim 13, further comprising:
forming a fill between the MTJ pillars;
forming a conformal stop layer on the MTJ pillars and the fill;
forming a conformal encapsulation layer on the stop layer;
removing the encapsulation layer and planarizing the MTJ pillars and the fill down to the conformal stop layer;
forming a second metal layer on the planarized MTJ pillars and the conformal stop layer;
forming a top contact mask on the second metal layer; and
selectively etching the second metal layer exposed by the top contact mask to form top contacts coupled to the pillar contacts in the MTJ pillars.

24. The method according to claim 23, wherein removing the encapsulation layer and planarizing the MTJ pillars and the fill down to the conformal stop layer include Chemical Mechanical Polishing (CMP) the encapsulation layer, the MTJ pillars and fill until the conformal stop on the fill is reached.

25. The method according to claim 13, wherein the exchange spring layer layer includes a layer of Iron Platinum (FePt) or Cobalt Chromium Platinum (CoCrPt) with a thickness of approximately 1-5 nm.

* * * * *